United States Patent [19]

Wei et al.

[11] Patent Number: 5,440,570
[45] Date of Patent: Aug. 8, 1995

[54] REAL-TIME BINARY BCH DECODER

[75] Inventors: Shyue-Win Wei, Chang Hua Hsien; Che-Ho Wei, Hsin Chu, all of Taiwan

[73] Assignee: National Science Council, Taiwan

[21] Appl. No.: 823,981

[22] Filed: Jan. 22, 1992

Related U.S. Application Data

[63] Continuation-in-part of Ser. No. 499,664, Mar. 27, 1990, abandoned.

[51] Int. Cl.$^6$ .................... G06F 11/10; H03M 13/00
[52] U.S. Cl. .................................. 371/37.1; 371/37.5
[58] Field of Search .................. 371/37.1, 37.5, 37.3, 371/25.1, 38.1, 39.1, 67.1; 364/746.1

[56] References Cited

U.S. PATENT DOCUMENTS

| | | |
|---|---|---|
| 4,191,970 | 3/1980 | Witsenhausen et al. |
| 4,397,022 | 8/1983 | Weng et al. |
| 4,679,082 | 7/1987 | Shibasaki |
| 4,723,243 | 2/1988 | Joshi et al. |
| 4,763,330 | 8/1988 | Shimizu |
| 4,833,678 | 5/1989 | Cohen |
| 4,845,713 | 7/1989 | Zook ............................... 371/37 |
| 4,873,688 | 10/1989 | Maki et al. |
| 4,914,660 | 4/1990 | Hirose |
| 4,945,537 | 7/1990 | Harada |
| 4,958,348 | 9/1990 | Berlekamp et al. ............. 371/37.1 |
| 5,020,060 | 5/1991 | Murai et al. |
| 5,040,179 | 8/1991 | Chen ................................ 371/37.1 |

Primary Examiner—Robert W. Beausoliel, Jr.
Assistant Examiner—Phung My Chung
Attorney, Agent, or Firm—Andrus, Sceales, Starke & Sawall

[57] ABSTRACT

A decoder is utilized for the correction of bit errors occurred in BCH (Bose-Chaudhuri-Hocquenghem) codes. The decoder first calculates the syndromes of a received word. The syndrome values form a first group of syndrome matrices whose determinant values are used for determining the weight of the error pattern of the received word. Subsequently, during each error trial testing, the bits constituting the received word are cyclically shifted and a predetermined bit is inverted to form a new word to see how the corresponding weight of the error pattern is changed thereby. If the weight is increased, the predetermined bit before being inverted is a correct one; otherwise if decreased the same is an erroneous one and thus correcting action is undertaken. The weight of the error pattern of a word is determined by the zeroness of the determinants of a plurality of matrices formed by the syndrome values thereof.

9 Claims, 27 Drawing Sheets

REAL-TIME BINARY BCH DECODER

CROSS-REFERENCES TO RELATED APPLICATIONS

This application is the continuation-in-part (CIP) of a previous application entitled "METHOD AND APPARATUS FOR DECODING CYCLIC CODES ON A STEP-BY-STEP BASIS" filed on Mar. 27, 1990 under the Ser. No. 07/499,664. This application is also a divisional application of the same, with the other application entitled: "A METHOD OF DECODING REED-SOLOMON CODES AND A DECODER FOR PERFORMING THE METHOD".

BACKGROUND OF THE INVENTION

1. Field of the Invention

The present invention relates to a decoder utilized in the receiving end of a data communication system for correcting bit errors in a received digital data. In particular, the received digital data have been encoded into BCH (Bose-Chaudhuri-Hocquenghem) codes before being transmitted.

2. Description of Prior Art

In a digital data communication system which sends out digital information through a channel to a receiver, due to noises and/or distortions, the received digital informations often contain a number of bit errors. To overcome this problem, a BCH encoding and decoding technique is often utilized. The BCH encoding and decoding technique has been developed respectively and independently by Bose, Chaudhuri, and Hocquenghem.

Referring to FIG. 1, there is shown the schematic diagram of a digital communication system. In the digital communication system, the transmitter thereof includes a BCH encoder 1 and a modulator 2 and the receiver thereof includes a demodulator 4 and a BCH decoder 5. A message information which is to be transmitted is firstly converted to a series of binary words, each of which has a bit length of k as shown in FIG. 2. A binary word in the message information is often represented by a polynomial I(x), where $$I(x) = I_0 + I_1 \cdot x + I_2 \cdot x^2 + \ldots + I_{k-1} \cdot x^{k-1}$$

where $I_p$, $p = 0, 1, 2, \ldots k-1$ are the bits constituting the binary word and $I_0$ is the lowest order bit and $I_{k-1}$ is the highest order bit. Each of the binary words I(x) is then processed by the BCH encoder 1 in such a way that a number of check bits are appended to the lowest order bits $I_0$ to form a codeword with a bit length of n and which is represented by a polynomial C(x), where $$C(x) = c_0 + c_1 \cdot x + c_2 \cdot x^2 + \ldots + c_{n-1} \cdot x^{n-1}$$

wherein $C_0$ to $C_{n-k-1}$ are the check bits and $C_{n-k}$ to $C_{n-1}$ are the information bits.

The codewords are then modulated by the modulator 2 for transmission and then transmitted via a channel 3 to the receiver of the communication system. The demodulator 4 demodulates the received signal into a series of binary words, each of which corresponds to a codeword. If there is not bit errors occurred in a received word, the bit pattern thereof is the same as the corresponding codeword. Otherwise, the bit pattern of the received word is different from that of the corresponding codeword and the difference therebetween is called an error pattern of the received word. The error pattern can be expressed by a polynomial as:

$$E(x) = e_0 + e_1 \cdot x + e_2 \cdot x^2 + \ldots + e_{n-1} \cdot x^{n-1}$$

Accordingly, the received word R(x) can be expressed as:

$$\begin{aligned} R(x) &= C(x) + E(x) \\ &= r_0 + r_1 \cdot x + r_2 \cdot x^2 + \ldots + r_{n-1} \cdot x^{n-1} \end{aligned}$$

The BCH decoder 5 is employed for detecting if there is any bit error occurred in each of the received words and performing necessary correcting actions to the erroneous bits.

If the BCH decoding technique utilized herein allows the BCH decoder 5 to detect and correct at most t erroneous bit in each received word, the codeword is denoted as a t-error-correcting (n, k, $d_{min}$) bp BCH code, where n is the block length of the codeword and $n = 2^m - 1$, m is an integer and $m \geq 3$;

k is the number of the information bits in the codeword and $k \geq n - mt$; and $d_{min}$ is the minimum distance of code and $d_{min} \geq 2t + 1$.

For a thorough and more detailed understanding of the BCH codes, readers may turn to a textbook "*Error Control Coding: Fundamental and Applications*" authored by Shu Lin & Daniel J. Costello, Jr. and published by Prentice Hall.

The bit errors occurred in a received binary word that has been encoded into a t-error-correcting BCH codeword can all be corrected faithfully if the total number of the bit errors is equal to or less than t, where t is a predetermined number. A selection of a larger t will lead to a longer length of the check bits in a codeword and to a more complex decoding process.

Among the methods of decoding binary BCH codes, a standard algebraic decoding method is most commonly used. The standard algebraic decoding method comprises essentially the following three steps of:

(a) calculating the syndrome values $S_i$, $i = 1, 2, \ldots, 2t$, where t is the maximum number of bit errors guaranteed to be corrected, from the polynomial R(x) of a received codeword;

(b) determining an error-location polynomial $\sigma(x)$ from the syndrome values $S_i$, $i = 1, 2, \ldots, 2t$;

(c) determining the locator(s) of the erroneous bit(s) by finding the roots of $\sigma(x) = 0$.

For the Step (b), an iteration algorithm proposed by Berlekamp is best known. And for the Step (c), a search algorithm proposed by Chien is considered to be the most efficient method. Generally speaking, the development of an algorithm for performing the task of Step (b) is most complicated and tedious.

Another algebraic decoding method, known as a step-by-step decoding method, has been proposed by Massey in 1965 for the decoding of BCH codes. The method proposed by Massey comprises the following steps of:

STEP (0):
  Set $j = 0$.
STEP (1):
  Determine from s(X) whether $\det(L_t) = 0$.
STEP (2):

If $\det(L_t)=0$, complement $s_j$, increase j by one, and go to STEP (1). Otherwise, set j=1 and go to STEP (3).

STEP (3):

Temporarily complement $r_{n-j}$ and determine from the modified syndrome whether $\det(L_t)=0$.

STEP (4):

If $\det(L_t)=0$, set $r_{n-j}=r_{n-j}+1$. Otherwise, set $r_{n-j}=r_{n-j}$.

STEP (5):

If j=n−r, stop. Otherwise, increase j by one and go to STEP (3).

For the definitions of the denotations used and a detailed understanding of the foregoing algorithm and the overall step-by-step decoding method according to Massey, readers are directed to a technical paper entitled "Step-by-step Decoding of the Bose-Chaudhuri-Hocquenghem Codes" published on *IEEE TRANSACTIONS ON INFORMATION THEORY*, Vol. IT-11, No. 4, pp. 580–585, Oct., 1965.

The basic principle of the step-by-step decoding method according to Massey is that each of the bits constituting a received binary word is inverted one at a time to form a new word, and then the new word is tested to see if the weight of the error pattern (the number of erroneous bits) thereof is reduced or increased. If reduced, the bit that has been inverted is an erroneous bit; otherwise if increased, the bit is a correct bit.

The step-by-step decoding method proposed by Massey does not include steps of calculating the coefficients of the error location polynomial $\sigma(x)$ and searching for the roots of the same. As a result, the step-by-step decoding method is less complex than the standard algebraic method.

Despite the advantage, the step-by-step decoding method according to Massey is, however, still not considered appropriate to be implemented by hardware, i.e. by logic circuits. By Massey's method, the bit errors in the received word R(x) is achieved by determining whether the value $\det(L_t)$ is zero or not (see STEP(2)). As a consequence, even if the total number of erroneous bits in a received word is much less than t, a special circuit must be used to change the values of some of the correct bits in the received word until the weight of the error pattern has reached t.

In addition, the Massey's method use the element $\alpha^{n-1}$ to complement the syndrome values (see STEP (3) and FIG. 1 in Massey's technical paper). As a consequence, all the m bits constituting each syndrome values might need to be inverted one by one.

SUMMARY OF THE INVENTION

It is an object of the present invention to provide a decoder using a modified step-by-step decoding method for decoding BCH codewords, which, when implemented by a hardware decoder, allows less complex construction of the hardware decoder.

It is another object of the present invention to provide a decoder using a modified step-by-step decoding method which allows the hardware decoder to decode received BCH codewords with a high speed.

The method used by the decoder first calculates the syndromes $S_i^{(0)}$, i=1,2,...,t of a received word R(x). The $S_i^{(0)}$, i=1,2,...,t form a first group of syndrome matrices $L_p^{(0)}$, p=1,2,...t whose determinant values $\det(L_p^{(0)})$ for p=1,2,...t are used for determining the weight of the error pattern of the received word R(x).

Subsequently, during each error trial process, the bits constituting the received word R(x) are cyclically shifted to form a shifted word $R^{(j)}(x)$ and a predetermined bit of the word $R^{(j)}(x)$ is inverted to form an error-trial word $\underline{R}^{(j)}(x)$. The syndromes $\underline{S}_i^{(j)}$, i=1,2,...,t of the error-trial word $\underline{R}^{(j)}(x)$ are then determined and which form the elements of a group of syndrome matrices $\underline{L}_p^{(j)}$, p=1,2,...t whose determinant values $\det(\underline{L}_p^{(j)})$, p=1,2,...t are used for determining the weight of the error pattern of the error-trial word $\underline{R}^{(j)}(x)$.

The weight of the error pattern of the received word R(x) and those of the error-trial words $\underline{R}^{(j)}(x)$, j=1,2,...,n−1 are compared. If the weight of the error pattern of a certain error-trial word $\underline{R}^{(j)}(x)$, $0 \leq j \leq n-1$ is larger by one than that of the received word R(x), the predetermined bit before being inverted is a correct one. Otherwise, if the weight of the error pattern of the error-trial word $\underline{R}^{(j)}(x)$ is less by one than that of the received word R(x), the predetermined bit before being inverted is an erroneous one and thus correcting action is undertaken.

A hardware decoder is provided for performing the aforementioned method of the present invention. The decoder comprises a syndrome generator for the generation of the syndromes $S_i^{(0)}$, i=1,2,...,t and $\underline{S}_i^{(j)}$, i=1,2,...,t. In accordance with a property, the syndrome generator needs only to generate the values $S_i^{(0)}$ for 1,3,...,2t−1 and the values $\underline{S}_i^{(j)}$ for i=1,3,...,2t−1.

The decoder further comprises a matrix calculation circuit which delivers out the values $\det(L_p^{(0)})$, p=1,2,...t if the inputs thereto are the syndrome values $S_i^{(0)}$, i=1,3,...,2t−1; and delivers out the values $\det(\underline{L}_p^{(j)})$, p=1,2,...t if the inputs thereto are the syndrome values $\underline{S}_i^{(j)}$, i=1,3,...,2t−1. An array of zero-checkers is used for determining the zeroness of $\det(L_p^{(0)})$, p=1,2,...t and delivers out an t-tuple decision vector $H^{(0)}$; and for determining the zeroness of $\det(\underline{L}_p^{(j)})$, p=1,2,...t and delivers out an t-tuple decision vector $H^{(j)}$.

A decision circuit is capable of determining in accordance with $H^{(0)}$ and $H^{(j)}$ whether a correcting action should be taken to the predetermined bit. If yes, the predetermined bit will be inverted and then sent out of the BCH decoder.

The modified step-by-step decoding method according to the present invention is considered to allow the construction of the hardware decoder with simple complexity. Furthermore, processing speed is also high enough to an acceptable degree.

BRIEF DESCRIPTION OF THE DRAWINGS

The present invention can be more fully understood by reading the subsequent section of detailed description of the preferred embodiments with references made to the accompanying drawings, wherein:

FIG. 9 is a schematic block diagram, showing the third embodiment (TYPE 3) of a syndrome generating module utilized in the BCH decoder of FIG. 6;

FIG. 9E shows a circuit used for generating $b_3^{(0)}(\alpha)$ in the

DETAILED DESCRIPTION OF THE PREFERRED EMBODIMENTS

Figure 1:
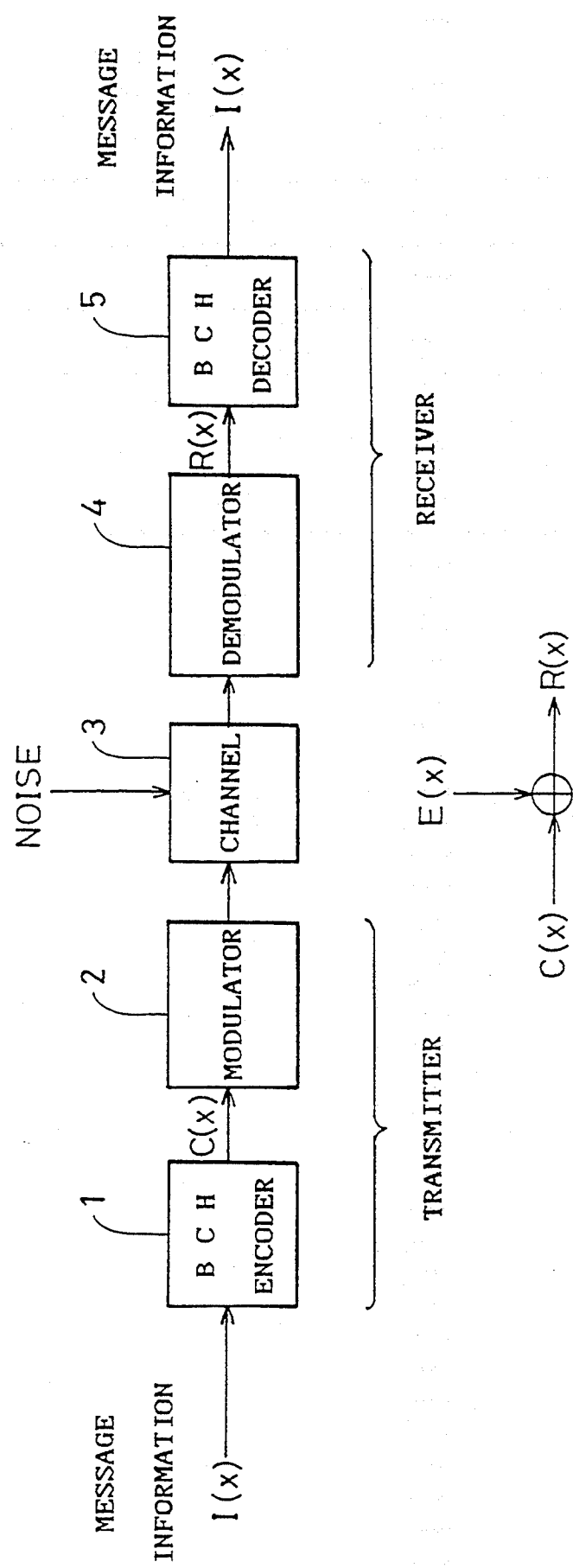
FIG. 1 shows a schematic diagram of a digital communication system.

If $\alpha$ is a primitive element in the Galois field $GF(2^m)$, the generator polynomial $G(x)$ of the $(n, k, d_{min})$ binary primitive BCH code, where $$G(x) = g_0 + g_1 \cdot x + g_2 \cdot x^2 + \ldots + g_{m \cdot t} \cdot x^{m \cdot t}, \quad (1)$$

is selected from a group of polynomials having the roots of $\alpha^1, \alpha^2, \ldots$ and $\alpha^{2t}$ and with the lowest degree. Let $$M_i(x) = M_{i,0} + M_{i,1} \cdot x + M_{i,2} \cdot x^2 + \ldots + M_{i,m} \cdot x^m \quad (2)$$

be the minimal polynomial of $\alpha^i$, where the coefficients $M_{i,p} \in GF(2)$, $p = 0, 1, \ldots m$, then $G(x)$ is the least common multiple (LCM) of $M_1(x), M_2(x), \ldots,$ and $M_{2t}(x)$, i.e.

$$G(x) \equiv LCM\{M_1(x), M_2(x), \ldots, M_{2t}(x)\} \quad (3)$$

Since it is known that $$M_{i \cdot 2p}(x) = M_i(x), \ p = 1, 2, \ldots, t, \ i = 1, 3, \ldots, 2t-1 \quad (4)$$

the generator polynomial $G(x)$ of Eq. (1) can be simplified as:

$$G(x) \equiv LCM\{M_1(x), M_3(x), \ldots, M_{2t-1}(x)\} \quad (5)$$

The maximum degree of each minimal polynomial is m and thus the degree of $G(x)$ is at most m·t. For example, if t=2, the degree of the generator polynomial $G(x)$ is 2m; and if t=3, the degree of the generator polynomial $G(x)$ is 3m, when m>3.

Figure 2:
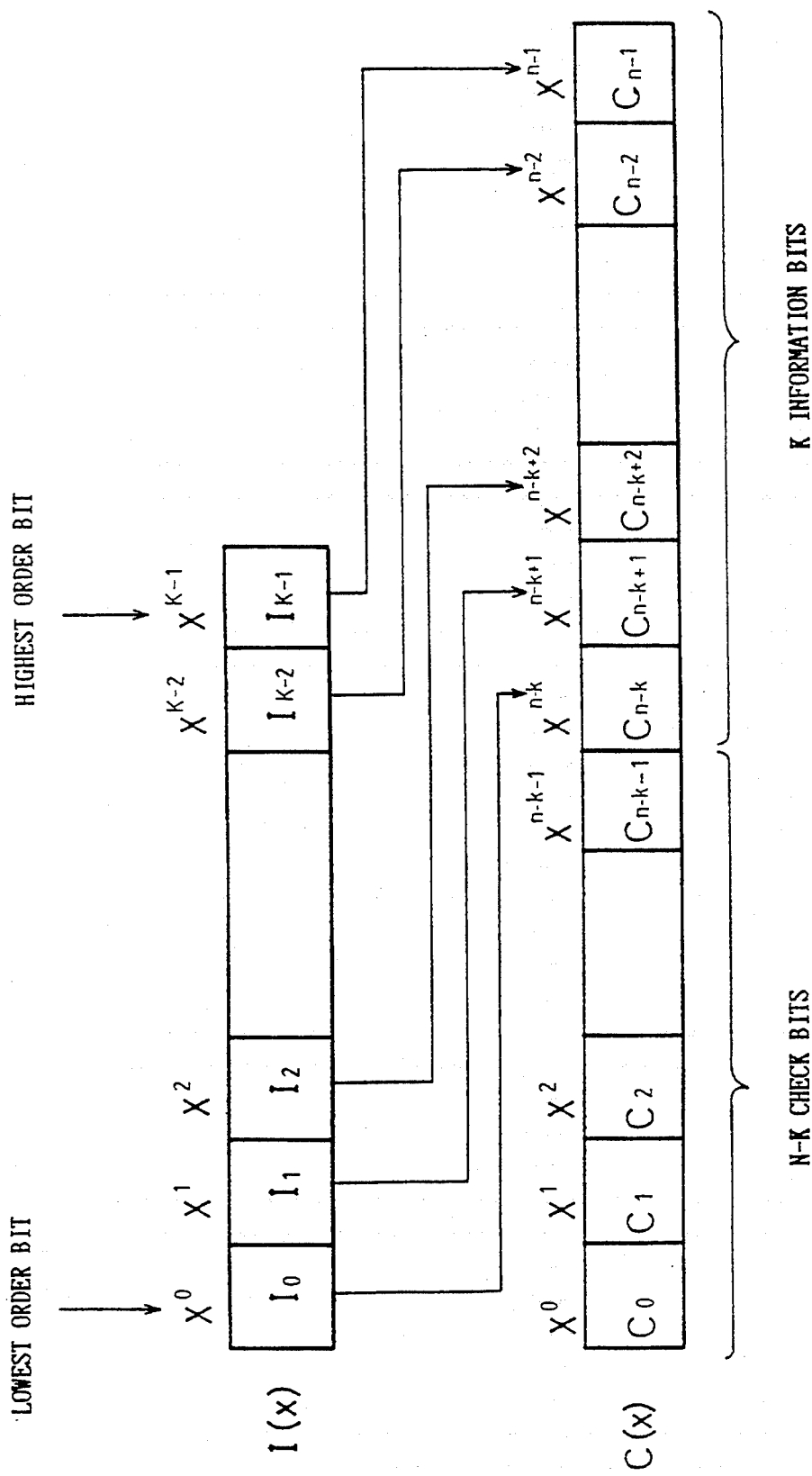
FIG. 2 shows the bit patterns of a binary word in a message information and a BCH codeword of the binary word.

As shown in FIG. 2, assume $I(x)$ is the polynomial corresponding to a binary information, $C(x)$ is the polynomial of the BCH code of the binary information, the encoding of $I(x)$ into $C(x)$ can be expressed mathematically as:

$$\begin{aligned} C(x) &= I(x) \cdot x^{n-k} + \text{Mod}\{I(x) \cdot x^{n-k}/G(x)\} \\ &= c_0 + c_1 \cdot x + c_2 \cdot x^2 + \ldots + c_{n-1} \cdot x^{n-1} \end{aligned} \quad (6)$$

where $\text{Mod}\{I(x \cdot x^{n-k})/G(x)\}$ represents the remainder polynomial of $I(x) \cdot x^{n-k}$ divided by $G(x)$ and which corresponds to the check bits $(C_0, C_1, \ldots, C_{n-k-1})$ added to the binary information $I(x)$. Clearly, $C(x)$ is divisible by $G(x)$. A codeword encoded by the above method is called as a systematic codeword.

Since $R(x) = C(x) + E(x)$, the syndrome values of the received word $R(x)$ can be computed by:

$$\begin{aligned} S_i^{(0)}(\alpha) &= R(x)|_{x=\alpha^i} \\ &= E(x)|_{x=\alpha^i}, \quad i = 1, 3, \ldots, 2t-1 \\ &= \text{Mod}\{R(x)/M_i(x)\}|_{x=\alpha^i} \end{aligned} \quad (7)$$

Each of the syndrome values $S_i^{(0)}$, $i = 1, 3, \ldots, 2t-1$ can be expressed in a binary form with m bits, or equivalently, as a polynomial $S_i^{(0)}(x)$, where $$S_i^{(0)}(x) = S_{i,0}^{(0)} + S_{i,1}^{(0)} \cdot x + S_{i,2}^{(0)} \cdot x^2 + \ldots + S_{i,m-1}^{(0)} \cdot x^{m-1} \quad (8)$$

The Modified Step-by-Step Decoding Method

The basic principle of the modified step-by-step decoding method in accordance with the present invention is that each of the bits in a received binary word is inverted one at a time to form a new word; and then the new word is tested to see if the weight of the error pattern (the number of error bits) thereof, compared with that of the original received binary word, is reduced or increased. If reduced, then the bit that has been inverted is an erroneous bit; if increased, then it is a correct bit.

Three theorems will be introduced first, which form the theoretical basis of the modified step-by-step decoding method employed in the present invention.

Theorem 1: For an (n, k, $d_{min}$) bp BCH code, define a syndrome matrix $L_p^{(0)}$, $1 \leq p \leq t$, which is given by:

$$L_p^{(0)} = \begin{bmatrix} S_1^{(0)} & 1 & 0 & \cdots & 0 \\ S_3^{(0)} & S_2^{(0)} & S_1^{(0)} & \cdots & 0 \\ & & \vdots & & \\ S_{2p-1}^{(0)} & S_{2p-2}^{(0)} & S_{2p-3}^{(0)} & \cdots & S_p^{(0)} \end{bmatrix}$$

where $p = 1, 2, \ldots, t$,
then $L_p^{(0)}$ is:
  singular if the number of bit errors is $p-1$ or less; and
  non-singular if the number of bit errors is exactly equal to p or equal to $p+1$.

Accordingly, there exists a relationship between the weight of the error pattern and the syndrome values. For a t-error-correcting bp BCH code, this relationship can be determined by using a direct solution method proposed by Peterson or by using a theorem proposed by Massey.

Using Theorem 1, the number of bit errors in a t-correcting bp BCH code can be determined in terms of the determinants of the matrices $L_1^{(0)}, L_2^{(0)}, \ldots,$ and $L_t^{(0)}$, i.e. $\det(L_1^{(0)}), \det(L_2^{(0)}), \ldots,$ and $\det(L_t^{(0)})$. For example, if $\det(L_4^{(0)}) = 0$, it is implied that the number of bit errors must be equal to or less than 3. Accordingly, the exact number of bit errors can be determined by finding out if the determinants of the matrices $L_1^{(0)}, L_2^{(0)}, \ldots,$ and $L_t^{(0)}$ are zero or not.

For example, in a double-error-correcting BCH code, i.e. $t=2$, the value of the determinants $\det(L_1^{(0)})$ and $\det(L_2^{(0)})$ with respect to the number of erroneous bits are as follows:

(1) If there is no bit error, then $\det(L_1^{(0)}) = 0$, and $\det(L_2^{(0)}) = 0$;

(2) If there is one bit error, then $\det(L_1^{(0)}) \neq 0$, and $\det(L_2^{(0)}) = 0$;

(3) If there are two bit errors, then $\det(L_1^{(0)}) \neq 0$, and $\det(L_2^{(0)}) \neq 0$;

And in the example of triple-error-correcting BCH codes, i.e. $t=3$, the value of the determinants $\det(L_1^{(0)})$, $\det(L_2^{(0)})$, and $\det(L_3^{(0)})$ with respect to the number of erroneous bits are as follows:

(1) If there is no bit error, then $\det(L_1^{(0)}) = 0$, $\det(L_2^{(0)}) = 0$, and $\det(L_3^{(0)}) = 0$.

(2) If there is no bit error, then $\det(L_1^{(0)}) \neq 0$, $\det(L_2^{(0)}) = 0$, and $\det(L_3^{(0)}) = 0$.

(3) If there is no bit error, then $\det(L_1^{(0)}) \neq 0$, $\det(L_2^{(0)}) \neq 0$, and $\det(L_3^{(0)}) = 0$.

(4) If there is no bit error, then $\det(L_1^{(0)}) = x$, $\det(L_2^{(0)}) \neq 0$, and $\det(L_3^{(0)}) \neq 0$.

where x is an arbitrary value which can be either zero or non-zero and is of no concern to the determination of the weight of the error pattern.

A decision vector $H^0$ consisting of t decision-bits is defined as:

$$H^{(0)} = [h_1^{(0)}, h_2^{(0)}, \ldots, h_t^{(0)}] \qquad (9)$$

where $h_p^{(0)} = 1$ if $\det(L_p^{(0)}) = 0$, and $h_p^{(0)} = 0$ if $\det(L_p^{(0)}) \neq 0$ for $p = 1, 2, \ldots, t$.

Thus, for the foregoing double-error-correcting bp BCH codes, the decision vector can be expressed as:
if there is no bit error, then $H^{(0)} = [1, 1]$;

if there is one bit error, then $H^{(0)} = [0, 1]$;

if there are two bit error, then $H^{(0)} = [0, 0]$;

And for the triple-error-correcting bp BCH codes, the decision vector can be expressed as:
if there is no bit error, then $H^{(0)} = [1, 1, 1]$;

if there is one bit error, then $H^{(0)} = [0, 1, 1]$;

if there are two bit error, then $H^{(0)} = [0, 0, 1]$; and if there are three bit errors, then $H^{(0)} = [x, 0, 0]$.

Since the four decision vectors [1,1,1], [0,1,1], [0,0,1], and [x,0,0] are different from one another, the number of bit errors in a received word can be determined in accordance therewith. However, one important thing to be noted is that the above theorem is valid only if the total number of bit errors in a received binary word is equal to or less than t. For a received binary word having bit errors exceeding the number of t, the present method is futile.

Before continuing to the subsequent description, a denotation will be introduced first and used herein and hereinafter. The denotation of "$1^n$" is employed for representing a stream of n identical bits of 1, and "$0^m$" for representing a stream of m identical bits of 0. Accordingly, for the general case of a t-error-correcting bp BCH code:

if there is no bit error, then $H^{(0)} \in \phi_0 = \{[1^t]\}$;

if there is one bit error, then $H^{(0)} \in \phi_1 = \{[0, 1^{t-1}]\}$;

if there are two bit errors, then $H^{(0)} \in \phi_2 = \{[0, 0, 1^{t-2}]\}$;

if there are p bit errors, $3 \leq p < t$, then $H^{(0)} \in \phi_p = \{[x^{p-2}, 0, 0, 1^{t-p}]\}$;

if there are t bit errors, then $H^{(0)} \in \phi_t = \{[x^{t-2}, 0, 0]\}$;

where the symbol "x" represents a don't care bit, and $\phi_k$ represents a set of all the decision vectors corresponding to error patterns with a weight k.

It can be found from the above deductions that $\phi_0$, $\phi_1$, $\phi_2$, ..., and $\phi_t$ can be distinguished from one another.

Figure 3:
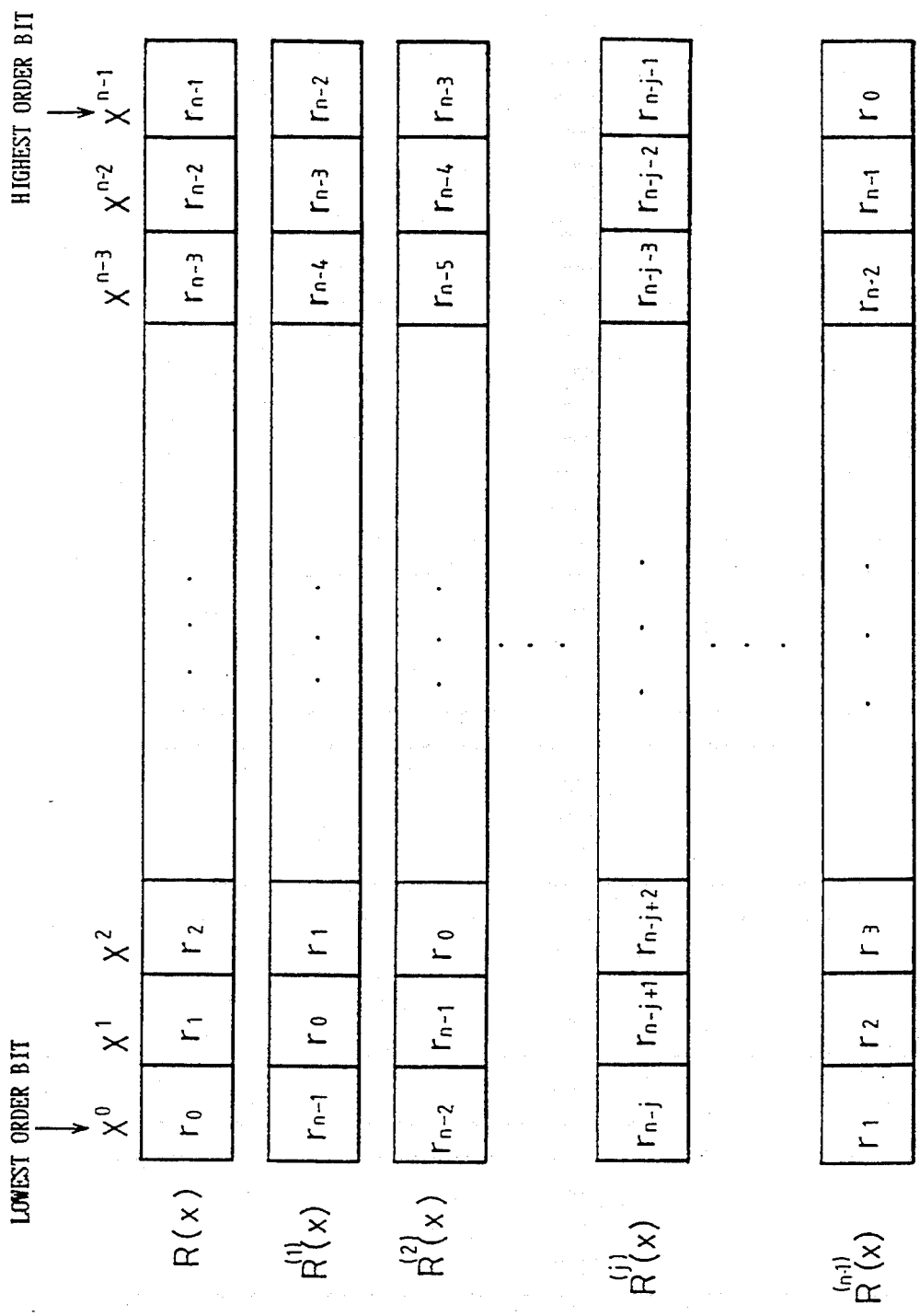
FIG. 3 shows how the bits constituting a received binary word R(x) are cyclically shifted.

Since a bp BCH code is a cyclic code, i.e. both a codeword and the received word corresponding to the codeword can be cyclically shifted without losing the informations contained therein. If $r^{(j)}(x)$ represents a word which is obtained by cyclically shifting each of the bits of R(x) j places to the right as shown in FIG. 3, i.e.

$$R^{(j)}(x) = \text{Mod}\left(\frac{x^j \cdot R(x)}{x^n + 1}\right) = r_{n-j} + r_{n-j+1} \cdot x + r_{n-j+1} \cdot x^2 + \ldots + r_{n-1} \cdot x^{j-1} + r_0 \cdot x^j + \ldots + r_{n-j-1} \cdot x^{n-1} \quad (10)$$

then by using Massey's theorems the value of the syndromes corresponding to $R^{(j)}(x)$, which are denoted by $S_i^{(j)}$, can be obtained as:

$$S_i^{(j)} = \text{Mod}\{r^{(j)}(x)/M_i(x)\}\big|_{x=\alpha^i} \quad (11)$$
$$= \text{Mod}\{x^j \cdot R(x)/M_i(x)\}\big|_{x=\alpha^i}$$
$$= S_i^{(0)}(\alpha) \cdot \alpha^{ij}$$

for i = 1, 3, ..., 2t−1.

Using the cyclical properties of the bp BCH codes, if the first position (the lowest order bit) of R(x) can be decoded correctly, then the entire word can be decoded correctly.

If a word R(x) is cyclically shifted to form a shifted word $R^{(j)}(x)$, then the changing of the lowest order bit of $R^{(j)}(x)$, i.e. complementing the bit $r_{n-j}$, can be mathematically expressed as $\underline{R}^{(j)}(x) = R^{(j)}(x) + 1$. If $\underline{S}_i^{(j)}$, i = 1,2, ..., 2t denote the values of the syndromes computed from $\underline{R}^{(j)}(x)$, then $\underline{S}_i^{(j)}$ can be expressed as:

$$\underline{S}_i^{(j)} = S_i^{(j)} + 1 \text{ for } i = 1, 2, \ldots, 2t \text{ and } 1 \leq j \leq n-1 \quad (12)$$

The number of erroneous bits contained in the word $R^{(j)}(x) + 1$ also can be determined by the principle of Theorem 1. Accordingly, a syndrome matrix $\underline{L}_p^{(j)}$ is defined as:

$$\underline{L}_p^{(j)} = \begin{bmatrix} \underline{S}_1^{(j)} & 1 & 0 & \ldots & 0 \\ \underline{S}_3^{(j)} & \underline{S}_2^{(j)} & \underline{S}_1^{(j)} & \ldots & 0 \\ \vdots & & & & \\ \underline{S}_{2p-1}^{(j)} & \underline{S}_{2p-2}^{(j)} & \underline{S}_{2p-3}^{(j)} & \ldots & \underline{S}_p^{(j)} \end{bmatrix} \quad (13)$$

where p = 1, 2, ..., t, and
j = 1, 2, ..., n−1. (13)

A decision vector $\underline{H}^{(j)}$ is defined as:

$\underline{H}^{(j)} = [\underline{h}_1^{(j)}, \underline{h}_2^{(j)}, \ldots, \underline{h}_t^{(j)}]$, wherein $\underline{h}_p^{(j)} = 1$ if $\det(\underline{L}_p^{(j)}) = 0$, and $\underline{h}_p^{(j)} = 0$ if $\det(\underline{L}_p^{(j)}) \neq 0$, (14)

for p = 1, 2, ..., t and j = 1, 2, ... n−1.

Thus, comparing the decision vector $\underline{H}^{(j)}$ with the decision vector $H^{(0)}$, the lowest order bit $r_{n-j}$ in $R^{(j)}(x)$ can be determined whether it is an erroneous bit. That is, if $H^{(0)} \in \phi_p$ and the bit $r_{n-j}$ before being complemented is a correct bit, then complementing the bit $r_{n-j}$ causes it to become an erroneous bit and whereby $\underline{H}^{(j)} \in \phi_{p+1}$. And if $H^{(0)} \in \phi_p$ and the bit $r_{n-j}$ before being complemented is an erroneous bit, then complementing the bit $r_{n-j}$ causes it to become a correct bit and whereby $\underline{H}^{(j)} \in \phi_{p-1}$.

Theorem 2: For a t-error-correcting (n, k, $d_{min}$) bp BCH code, if all the decision vector sets $\phi_p$, p = 1, 2, ..., t can be determined and further distinguished from one another, then any error pattern with a weight equal to or less than t can be corrected by the modified step-by-step decoding method.

The proof to the above theorem is by an induction method conducted to the following cases.

(Case 1: Weight of Error Pattern=1)

In this case, $H^{(0)} \in \phi_1$ and suppose that $r_{n-p}$ is the erroneous bit. If each of the bits $r_{n-1}, r_{n-2}, \ldots,$ and $r_0$ constituting a received binary word is inverted temporarily one at a time, then inverting a bit other than $r_{n-p}$ will increase the bit errors to two and thereby produce a corresponding decision vector of $H^{(j)} \in \phi_2, j \neq p$. And at the time the bit $r_{n-p}$ is inverted, there is produced a corresponding decision vector of $H^{(p)} \in \phi_0$. Since $\phi_0, \phi_1, \phi_2$ can be distinguished from one another, it is workable to find out the erroneous bit $r_{n-p}$ and perform a correction thereto.

(Case 2: Weight=2)

In this case, $H^{(0)} \in \phi_2$ and suppose that $r_{n-p}$ and $r_{n-q}$, $p<q$ are the erroneous bits. If each of the bits $r_{n-1}, r_{n-2}, \ldots, r_2, r_1,$ and $r_0$ constituting a received binary word is inverted temporarily one at a time, then inverting a bit other than $r_{n-p}$ and $r_{n-q}$ will increase the bit errors to three and thereby produce a corresponding decision vector of $H^{(j)} \in \phi_3, j \neq p$ and $j \neq q$. And at the time the erroneous bit $r_{n-p}$ is encountered and inverted, there is produced a corresponding decision vector of $H^{(p)} \in \phi_1$. Since $\phi_1, \phi_2, \phi_3$ can be distinguished from one another, it is workable to correct the first found erroneous bit $r_{n-p}$ and perform a correction thereto. Once the first found erroneous bit $r_{n-p}$ has been corrected, the weight of the error pattern is decreases to 1, thereby reducing the condition to the foregoing Case 1 and thus the remaining erroneous bit $r_{n-q}$ can be corrected using the inference of Case 1.

(Case 3: Weight=v, $3 \leq v < t$)

In this case, $H^{(0)} \in \phi_v$. If each of the bits $r_{n-1}, r_{n-2}, \ldots$ and $r_0$ constituting a received binary word is inverted temporarily one at a time, then inverting a bit $r_{n-s}$ other than any one of the v erroneous bits will increase the number of bit errors to $v+1$ and thereby produce a corresponding decision vector of $H^{(s)} \in \phi_{v+1}$. And at the time the first erroneous bit, say $r_{n-q}$, is encountered and inverted, there is produced a corresponding decision vector of $H^{(q)} \in \phi_{v-1}$. Since $\phi_{v-1}, \phi_v, \phi_{v+1}$ can be distinguished from one another, it is workable to correct the first found erroneous bit and perform a correction thereto. Once the first found erroneous bit has been corrected, the weight of the error pattern is decreases to $v-1$. Using the principle of induction and with the initial results of Case 1 and Case 2, the remaining $v-1$ erroneous bit in this case are also correctable.

(Case 4: Weight=t)

In this case, $H^{(0)} \in \phi_t$. If each of the bits $r_{n-1}, r_{n-2}, \ldots$ and $r_0$ constituting a received binary word is inverted temporarily one at a time, then inverting a bit $r_{n-s}$ other than the t erroneous bits will increase the bit error number to $t+1$. Since in a bp BCH code, the minimum distance $d_{min} \geq 2t+1$, it is possible for a certain received word $R(x)$ to become:

$$R(x) + n^{n-s} = C(x) + E(x) + x^{n-s} \quad (15)$$
$$= C'(x) + E'(x)$$

where $E'(x)$ is the polynomial of an error pattern with a weight of t. Clearly, the Hamming distance between $C(x)$ and $C'(x)$ is equal to the weight of $\{E(x)+x^{n-s}+E'(x)\}$. Accordingly, the decision vectors corresponding to $E'(x)$ and $E(x)+x^{n-s}$ can be distinguished from any other decision vector that belongs to the decision vector set of $\phi_{t-1}$.

At the time the first erroneous bit, say $r_{n-q}$, is encountered and inverted, there is produced a corresponding decision vector of $H^{(q)} \in \phi_{t-1}$ which can be distinguished from $\phi_t$.

Therefore, in conclusion, it is workable to correct the first found erroneous bit in the case and perform a correction thereto. Once the first found erroneous bit has been corrected, the weight of the error pattern is decreases to $t-1$. Using the principle of induction and with the initial results of Case 1 and Case 2, the weight in this case is correctable.

In summary, any combination of t or less bit errors in an error pattern of a received binary word can be decoded correctly with the step-by-step decoding method. Based on the foregoing deductions, the modified step-by-step decoding method employed in the decoder of the present invention is proposed for the decoding of a t-error-correcting (n, k, $d_{min}$) bp BCH code. In summary, the method of the present invention can be expressed by an algorithm which comprises the following steps of:

STEP (0):

Receiving a binary word $R(x)$ which has been encoded into a t-error-correcting BCH bp codeword before it is transmitted;

STEP (1):

Determining the syndromes $S_i^{(0)}, i=1, 2, \ldots, 2t$ of the received word $R(x)$;

STEP (2):

Computing $\det(L_p^{(0)})$ for $p=1, 2, \ldots t$, where $$L_p^{(0)} = \begin{bmatrix} S_1^{(0)} & 1 & 0 & \ldots & 0 \\ S_3^{(0)} & S_2^{(0)} & S_1^{(0)} & \ldots & 0 \\ \cdot & & & & \\ \cdot & & & & \\ \cdot & & & & \\ S_{2p-1}^{(0)} & S_{2p-2}^{(0)} & S_{2p-3}^{(0)} & \ldots & S_p^{(0)} \end{bmatrix}$$

STEP (3):

Determining a decision vector $$H^{(0)} = [h_1^{(0)}, h_2^{(0)}, \ldots, h_t^{(0)}],$$

where $h_p^{(0)} = 1$ if $\det(L_p^{(0)}) = 0$, and $h_p^{(0)} = 0$ if $\det(L_p^{(0)}) \neq 0$ for $p = 1, 2, \ldots, t$.

STEP (4):

Assigning $j = 1$;

STEP (5):

Determining the syndromes $S_i^{(j)}, i=1, 2, \ldots, 2t$ of the shifted word $R^{(j)}(x)$, where $R^{(j)}(x)$ is formed by shifting cyclically the bits constituting the received word $R(x)$ once to the right;

STEP (6):

Performing $S_i^{(j)} = S_i^{(j)} + 1$ for $i = 1, 2, \ldots, 2t$ to determine the syndromes of the error-trial word $R^{(j)}(x)$, where $R^{(j)}(x)$ is formed by complementing the lowest order bit $r_{n-j}$ of the shifted word $R^{(j)}(x)$;

STEP (7):

Computing $\det(\underline{L}_p^{(j)})$ for $p=1,2,\ldots,t$, where $$\underline{L}_p^{(j)} = \begin{bmatrix} S_1^{(j)} & 1 & 0 & \ldots & 0 \\ S_3^{(j)} & S_2^{(j)} & S_1^{(j)} & \ldots & 0 \\ \cdot & & & & \\ \cdot & & & & \\ S_{2p-1}^{(j)} & S_{2p-2}^{(j)} & S_{2p-3}^{(j)} & \ldots & S_p^{(j)} \end{bmatrix}$$

STEP (8):

determining a decision vector $$H^{(j)} = [h_1^{(j)}, h_2^{(j)}, \ldots, h_t^{(j)}],$$

wherein $h_p^{(j)} = 1$ if $\det(\underline{L}_p^{(j)}) = 0$, and $h_p^{(j)} = 0$ if $\det(\underline{L}_p^{(j)}) \neq 0$, for $p=1, 2, \ldots, t$.

STEP (9):

If $H^{(0)} \in \phi_p$ and $H^{(j)} \in \phi_{p-1}$, then jumping to STEP (10)

else jumping to STEP (11);

STEP (10):

performing $r_{n-j} = r_{n-j} + 1$ to correct the bit $r_{n-j}$ of the received binary word $R(x)$;

STEP (11):

performing $j = j+1$;

If $j < n$ then jumping to STEP (5)

else jumping to STEP (13);

STEP (13):

fetching $R(x)$ as the output word;

STEP (14):

if all received is not decoded then jumping to STEP (0) ending the decoding process.

In practical implementation, the determination of the syndromes $S_i^{(j)}$, $i=1,2,\ldots,2t$ of the error-trial word $R^{(j)}(x)$ from STEP 6 to STEP 7 does not have be involved in the steps of forming the error-trial word $R^{(j)}(x)$ first and then finding accordingly the syndromes thereof. In fact, the following relationship can be applied:

if $R^{(j)}(x) = R^{(j)}(x) + 1$, then $S_i^{(j)} = S_i^{(j)} + 1$ for $i=1,2,\ldots 2t$ In other words, a syndromes $\underline{S}_p^{(j)}$ can be obtained by simply complementing the lowest order bit of the syndrome value $S_p^{(j)}$.

The above-described modified step-by-step decoding method employed in the decoder of with the present invention can be easily implemented by software for the calculation of the many mathematical equations involved in the procedural steps thereof and for the correcting actions. However, in a high speed digital data communication system where real-time decoding is required, an implementation of the decoding by hardware is much preferred. Therefore, for real-world practice, the attention will be focus solely on how to configure a hardware decoder which is capable of performing the modified step-by-step decoding method of the present invention.

Hardware Implementation of the Decoding Method

Figure 4:
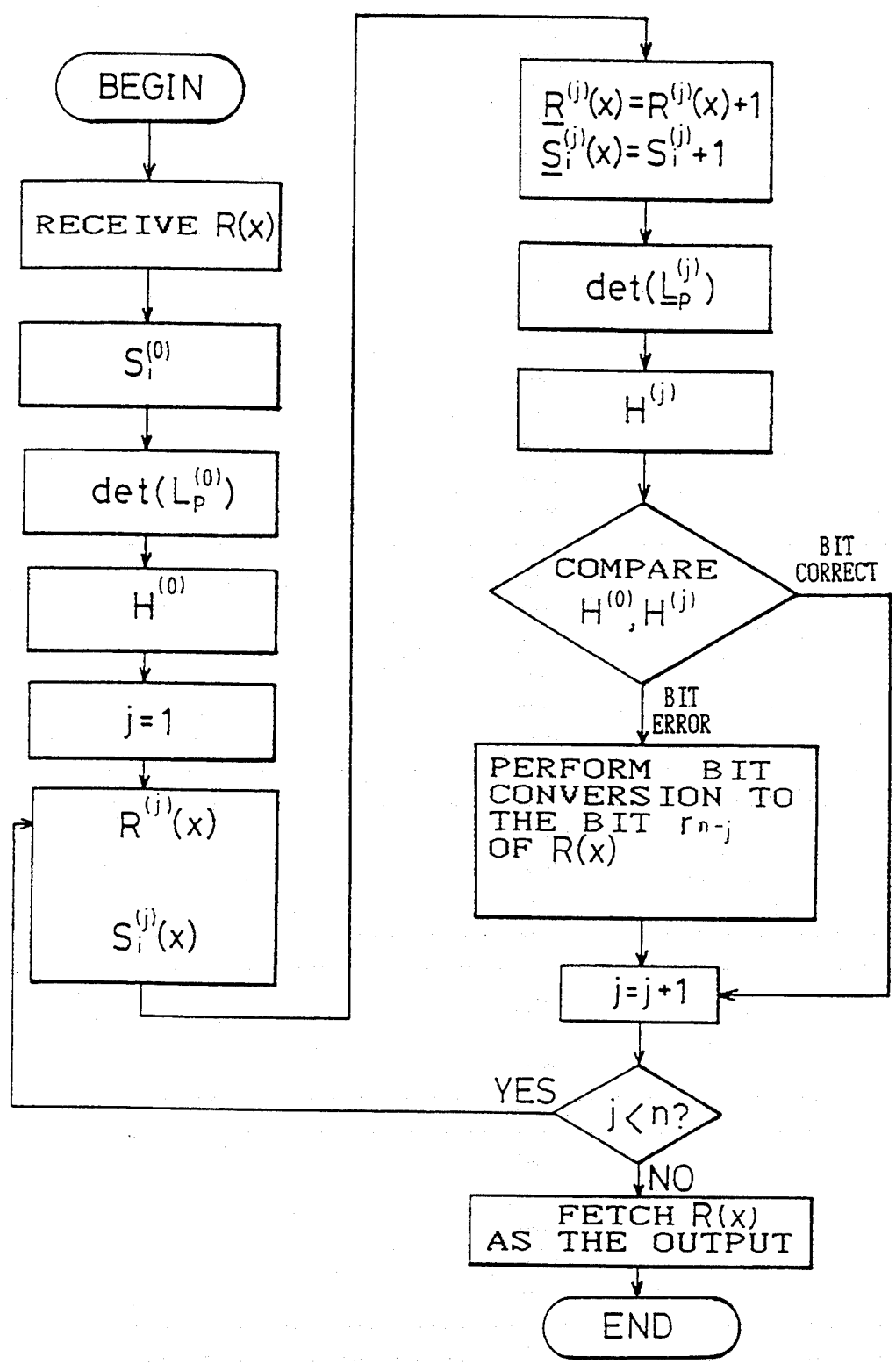
FIG. 4 is a flow diagram, showing the procedural steps of a modified step-by-step decoding method employed by the decoder according to the present invention.
Figure 5:
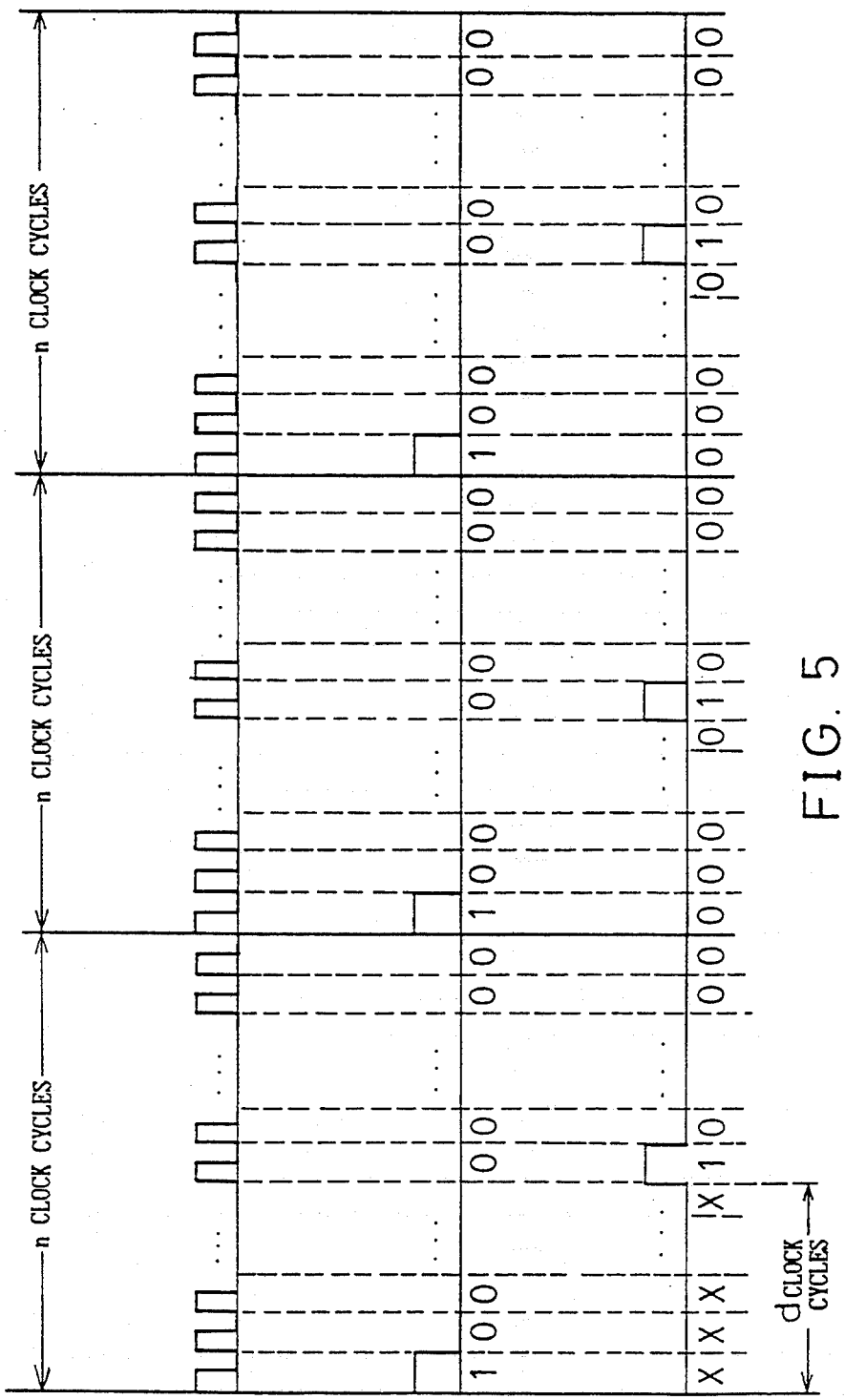
FIG. 5 shows the signal diagrams of a global clock CLK and two control sequences.

Referring to FIG. 4, the following denotations will be introduced first before continuing to the subsequent description. A bit sequence represented herein and hereinafter by:

$(1^t, 0^{n-t})_n^d$ denotes a periodical bit sequence having a period of n bits and having d delay bits preceding the first bit of the bit sequence. Each of the delay bits is with a don't-care value. The timing of a bit sequence $(1, 0^{n-1})_n^0$ and a bit sequence $(1, 0^{n-1})_n^d$ relative to a global clock CLK can be seen from FIG. 4.

A. The Decoder Structure

Figure 6:
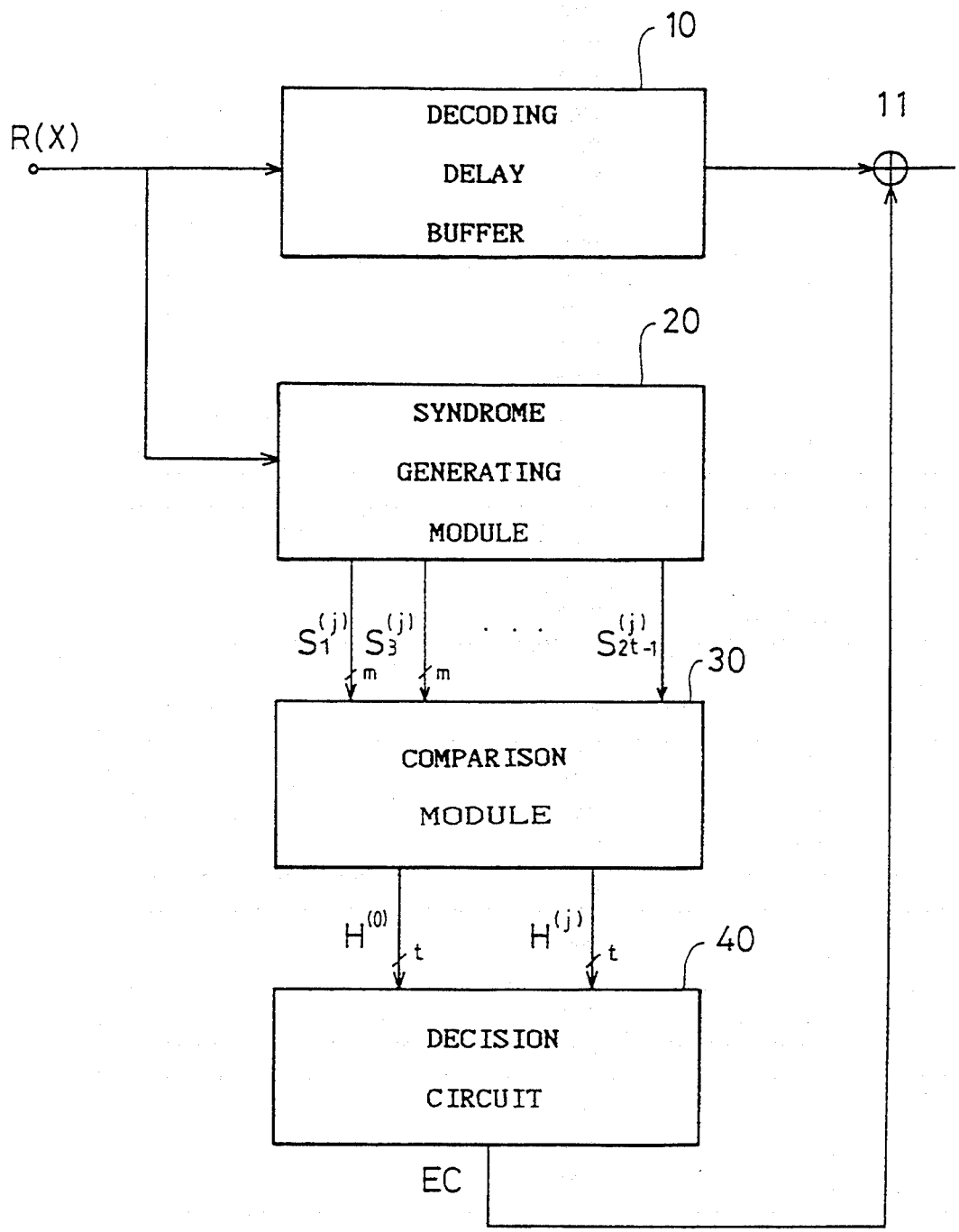
FIG. 6 shows the schematic block diagram of a BCH decoder configured in accordance with the present invention.

Referring to FIG. 6, there is shown the block diagram of a BCH decoder 5 configured for performing the modified step-by-step decoding method according to the present invention. The BCH decoder 5 comprises a decoding delay buffer 10, a syndrome generating module 20, a comparison module 30, and a decision circuit 40.

The decoding delay buffer 10 consists of $n+de+1$ shift registers (not shown), where de is the latency of the BCH decoder 5 and which will have a clear definition later in this description. When a binary word $R(x)$ is received by the BCH decoder 5, the received word $R(x)$ is stored temporally in the decoding delay buffer 10 with the highest order bit $r_{n-1}$ entering thereinto first. At the same time, the received word $R(x)$ is processed by the syndrome generating module 20. Since it is a known property of the syndromes that:

$S_{2p}^{(j)} = (S_p^{(j)})^2$ for any p and j, the syndrome generating module 20 is designed to generate only the syndromes $S_i^{(j)}$, $i=1,3,\ldots 2t-1$ for $j=0,1,2,\ldots,n-1$, i.e. to generate one of the groups $\{S_1^{(j)}, S_3^{(j)}, \ldots S_{2t-1}^{(j)}\}$ $j=0,1,2,\ldots,n-1$ in a sequential order during a clock cycle following the other.

The circuit of the syndrome generating module 20 has three feasible configurations, TYPE 1, TYPE 2, and TYPE 3, which are described respectively hereinunder.

TYPE 1 of the Syndrome Generating Module 20

Referring to FIGS. 7A–7E, the TYPE 1 configuration of the syndrome generating module 20 comprises a systolic syndrome generator 211 and a systolic shifted-word syndrome generator 212 coupled to the output of the systolic syndrome generator 211.

The function of the systolic syndrome generator 211 is to generate the syndromes $\{S_1^{(0)}, S_3^{(0)}, \ldots, S_{2t-1}^{(0)}\}$ of a received word $R(x)$. The systolic syndrome generator 211 comprises an array of t syndrome generating cells 213, each of which is designed for the generation of one of the syndromes $\{S_1^{(0)}, S_3^{(0)}, \ldots, S_{2t-1}^{(0)}\}$.

Figure 7A:
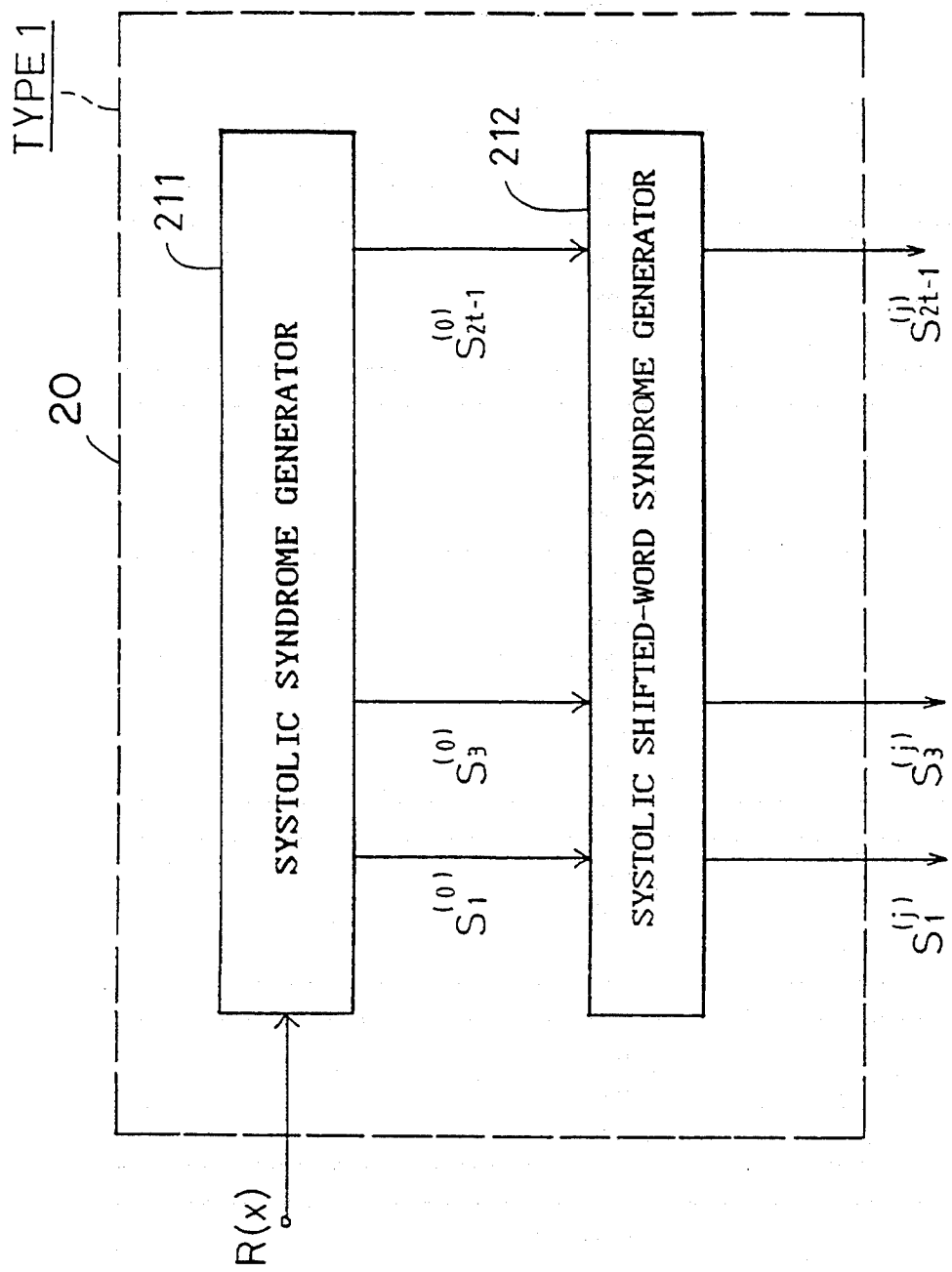
FIG. 7A is a schematic block diagram, showing the first embodiment (TYPE 1) of a syndrome generating module utilized in the BCH decoder of FIG. 6.
Figure 7B:
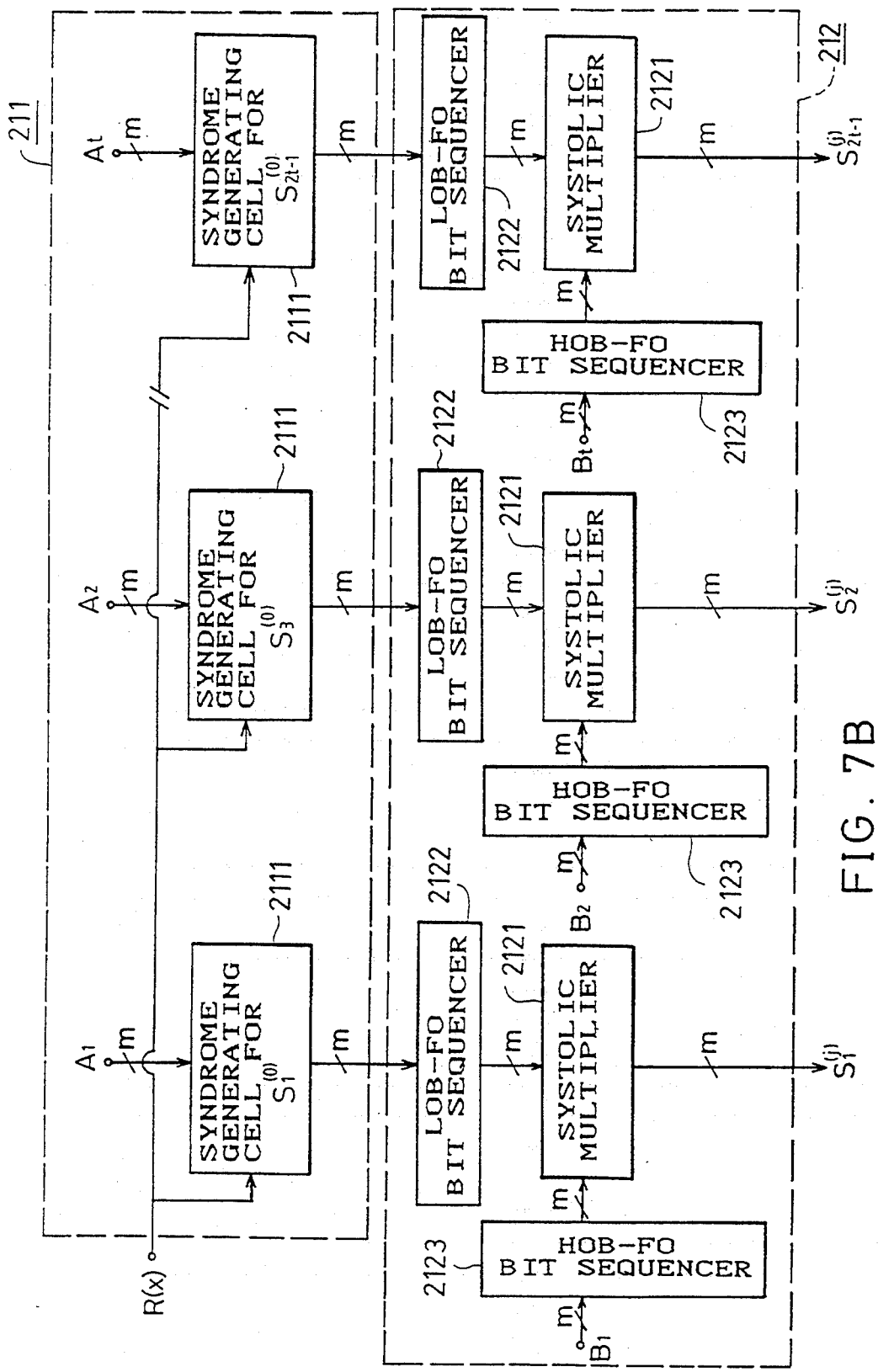
FIG. 7B shows the detailed configuration of the block diagram of FIG. 7A.

As shown in more detail in FIG. 7B, the systolic syndrome generator 211 comprises an array of t syndrome generating cells 2111, each of which is used independently for generating one of the syndromes $\{S_1^{(0)}, S_3^{(0)}, \ldots, S_{2t-1}^{(0)}\}$. The design of one specific syndrome generating cell is in accordance with the following equation:

$$S_i^{(0)} = R(x)\bigg|_{x=\alpha^i}$$
$$= \sum_{p=0}^{n-1} r_p \cdot \alpha^{p \cdot i}$$

Each of the $GF(2^m)$ elements is input to the associated syndrome generating cell via each of the input ports $A_1$, $A_2, \ldots,$ and $A_t$.

Illustrated as an example, the design of the syndrome generating cells utilized in a (15,7,5) double-error-correcting BCH decoder for generating $S_1^{(0)}$ and $S_3^{(0)}$ is therefore in accordance with the following equations:

$$S_1^{(0)} = R(x)\bigg|_{x=\alpha^1}$$
$$= \sum_{p=0}^{14} r_p \cdot \alpha^p$$

and $$S_3^{(0)} = R(x)\bigg|_{x=\alpha^3}$$
$$= \sum_{p=0}^{14} r_p \cdot \alpha^{3p}$$

Figure 7C:
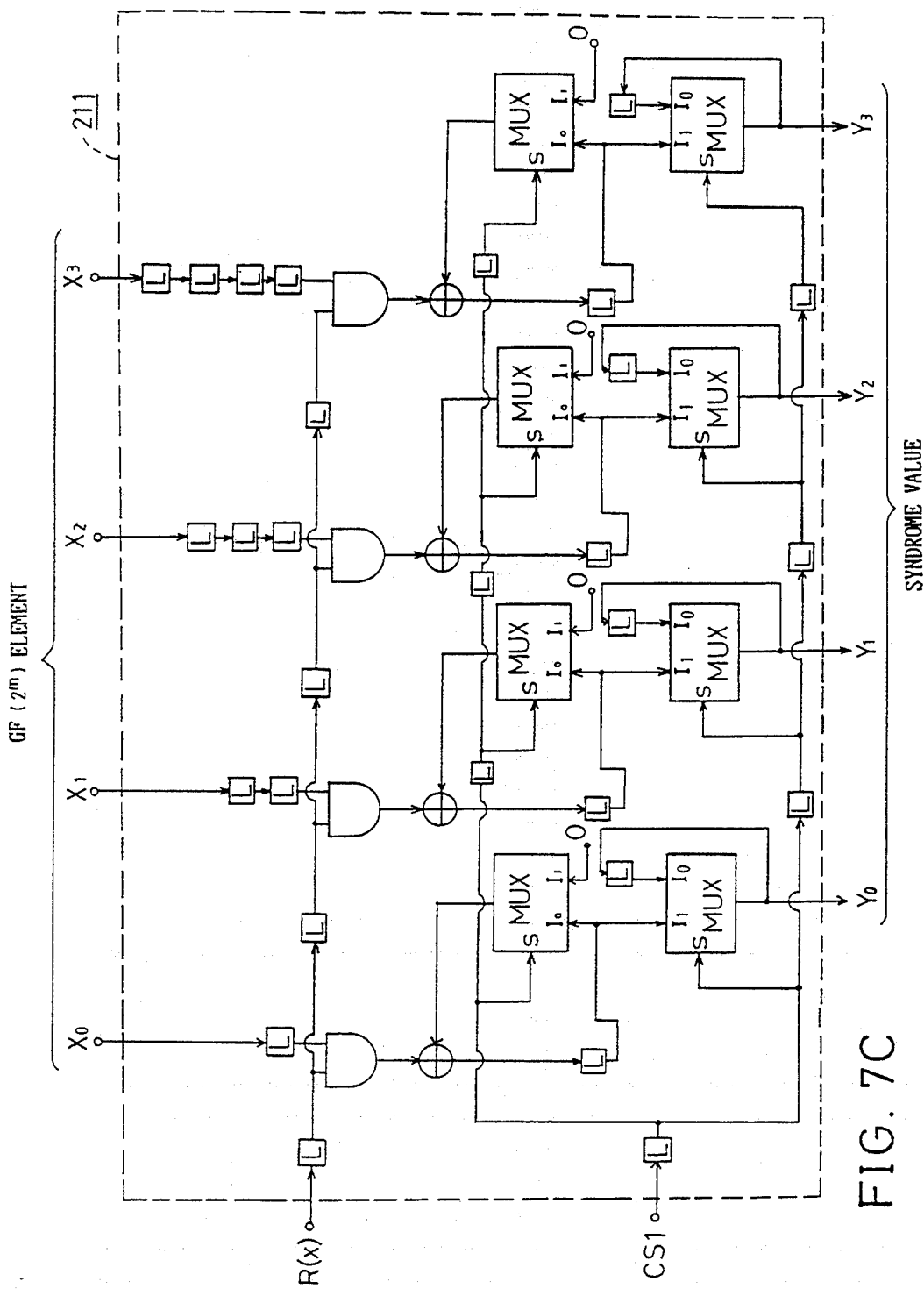
FIG. 7C shows the detailed circuit diagram of a syndrome generating cell utilized in the circuit of FIG. 7B.

The circuit configurations of the systolic syndrome generating cells for generating $S_1^{(0)}$ and for generating $S_3^{(0)}$ utilized in the decoding of double-error-correcting (15,7,5) BCH codes, i.e. t=2, are the same and shown in FIG. 7C. For a detailed and thorough understanding of the circuit of FIG. 7C, reference can be made to a technical paper entitled "*A VLSI ARCHITECTURE FOR IMPLEMENTATION OF THE DECODER FOR BINARY BCH CODES*" by Dr. C. L. Wang and published on *PROCEEDINGS OF INTERNATIONAL SYMPOSIUM ON COMMUNICATIONS*, 1991.

As shown in FIG. 7C, in the syndrome generating cell for generating $S_1^{(0)}$, the bits constituting the received word R(x) are sent into the syndrome generating cell in a sequential order of $(r_{14}, r_{13}, r_{12}, \ldots r_1, r_0)$, and at the same the four input lines $x_0, x_1, x_2,$ and $x_3$ constituting the input port $A_1$ receives the bits constituting each of the $GF(2^4)$ elements in a sequential order of $\{\alpha^{14}, \alpha^{13}, \alpha^{12}, \ldots, \alpha^1, \alpha^0\}$.

The organization of the syndrome generating cell for generating $S_3^{(0)}$ is basically identical except that in this case the input $GF(2^4)$ elements are $\{\alpha^{42}, \alpha^{39}, \alpha^{36}, \ldots, \alpha^3, \alpha^0\}$. Using Galois Field operations, $\alpha^{42} = \alpha^{12}$, $\alpha^{39} = \alpha^9$, $\alpha^{36} = \alpha^6 \ldots$ and so on.

A control sequence $CS_1$, where $$CS_1 = (1, 0^{n-1})_n^0,$$

is employed in the syndrome generating cells for the selection control of the multiplexers MUX. In each of the multiplexers MUX, if a selection bit 0 is present, $I_0$ is selected as the output; otherwise if a selection bit 1 is present, $I_1$ is selected as the output.

During the clock cycle of the appearance of the first bit 1 in $CS_1$, the first syndrome generating cell for generating $S_1^{(0)}$ sends out in parallel the four bits $(S_{1,0}^{(0)}, S_{1,1}^{(0)}, S_{1,2}^{(0)}, S_{1,3}^{(0)})$ constituting the syndrome value $S_1^{(0)}$ from the output lines $y_0, y_1, y_2,$ and $y_3$; and the second syndrome generating cell for generating $S_3^{(0)}$ sends out in parallel the four bits $(S_{3,0}^{(0)}, S_{3,1}^{(0)}, S_{3,2}^{(0)}, S_{3,3}^{(0)})$ constituting the syndrome value $S_3^{(0)}$. During the following n−1 clock cycles, the two syndrome generating cells maintain the syndromes $S_1^{(0)}$ and $S_3^{(0)}$ as the outputs.

The function of the systolic shifted-word syndrome generator 212 coupled to the output of the systolic syndrome generator 211 is to generate the syndromes $\{S_1^{(j)}, S_3^{(j)}, \ldots, S_{2t-1}^{(j)}\}$, for $j=0,1,2,\ldots,n-1$ of the shifted words $R^{(j)}(x)$ in accordance with the received syndrome values $\{S_1^{(0)}, S_3^{(0)}, \ldots, S_{2t-1}^{(0)}\}$.

Figure 7D:
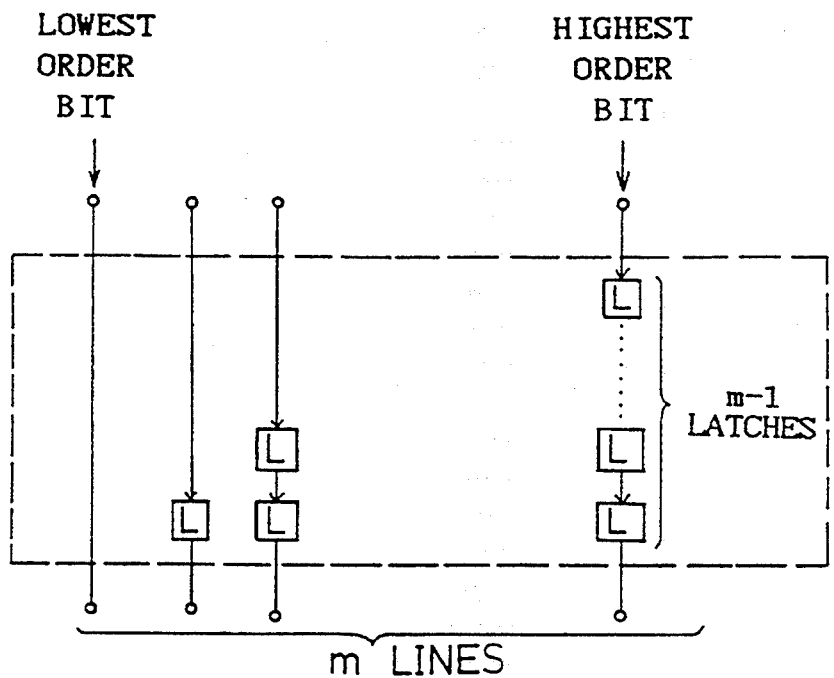
FIG. 7D shows the configuration of an m-bit LOB-FO (Lower-Order-Bit-First-Out) bit sequencer.
Figure 7E:
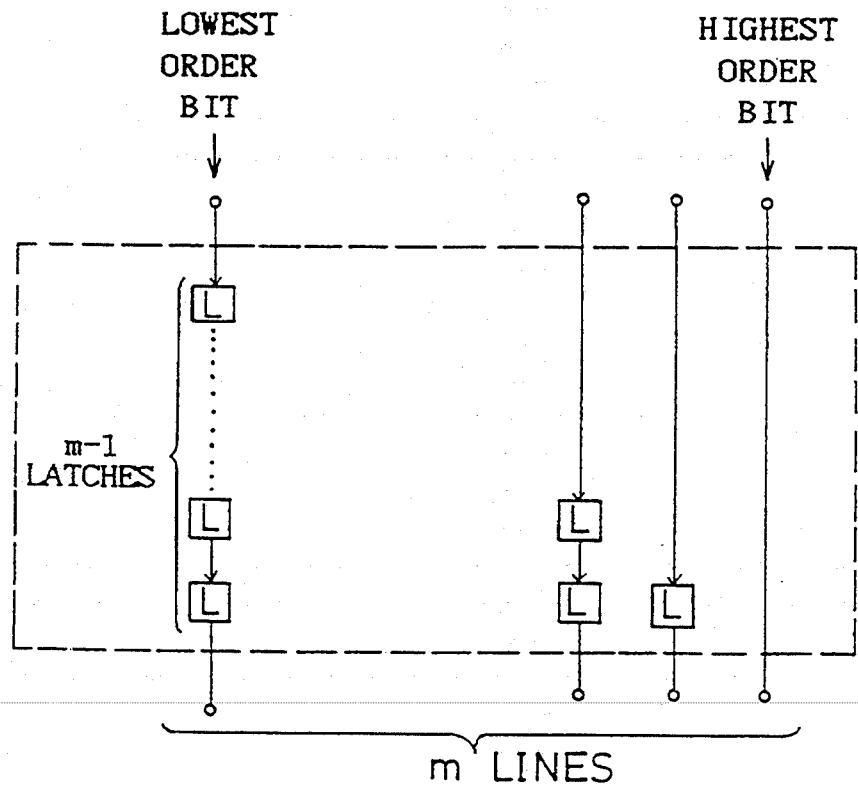
FIG. 7E shows the configuration of an m-bit HOB-FO (Higher-Order-Bit-First-Out) bit sequencer.

As shown in more detail in FIG. 7B, the systolic shifted-word generator 212 comprises an array of t systolic multiplier 2121, each of which is coupled with an LOB-FO (which stands for Lower-Order-Bit-First-Out) bit sequencer 2122 and a HOB-FO (which stands for Higher-Order-Bit-First-Out) bit sequencer 2123. The detailed circuit configuration of the LOB-FO bit sequencer 2122 is shown in FIG. 7D; and that of the HOB-FO bit sequencer 2123 is shown in FIG. 7E.

The array of systolic multipliers 2121 are employed for performing the following mathematical relationship between the syndromes $\{S_1^{(j)}, S_3^{(j)}, \ldots, S_{2t-1}^{(j)}\}$ and the syndromes $\{S_1^{(0)}, S_3^{(0)}, \ldots, S_{2t-1}^{(0)}\}$:

$$S_i^{(j)} = S_i^{(0)} \cdot (\alpha^i)^j \quad i=1,3,\ldots,2t, \quad j=0,1,2,\ldots,n-1$$

The syndromes $\{S_1^{(0)}, S_3^{(0)}, \ldots, S_{2t-1}^{(0)}\}$ are input to the systolic multiplier 2121 via the LOB-FO circuits 2122; and the $GF(2^m)$ elements are input to the same from the ports $B_1, B_2, \ldots B_t$ and via the HOB-FO circuits 2123. For a more detailed understanding of the systolic multiplier 2121, reference can be made to a technical paper entitled "*SYSTOLIC MULTIPLIERS FOR FINITE FIELDS GF(2^m)*" by Dr. C. S. Yeh and published on *IEEE TRANSACTIONS ON COMPUTERS*, Vol. C-33, pp.357. The theoretical backgrounds for the couplings of the LOB-FO circuits 2122 and the HOB-FO circuits 2123 can be found in the same technical paper.

Since there are n clock cycles required by the systolic syndrome generator 211 to obtain the syndromes $\{S_1^{(0)}, S_3^{(0)}, \ldots, S_{2t-1}^{(0)}\}$, the latency thereof is n. As for the systolic shifted-word syndrome generator 212, since the latency of the systolic multiplier is 2m and there are m−1 latches used at the output ports of the systolic multiplier, the latency thereof is 3m−1.

TYPE 2 of the Syndrome Generating Module 20

Figure 8A:
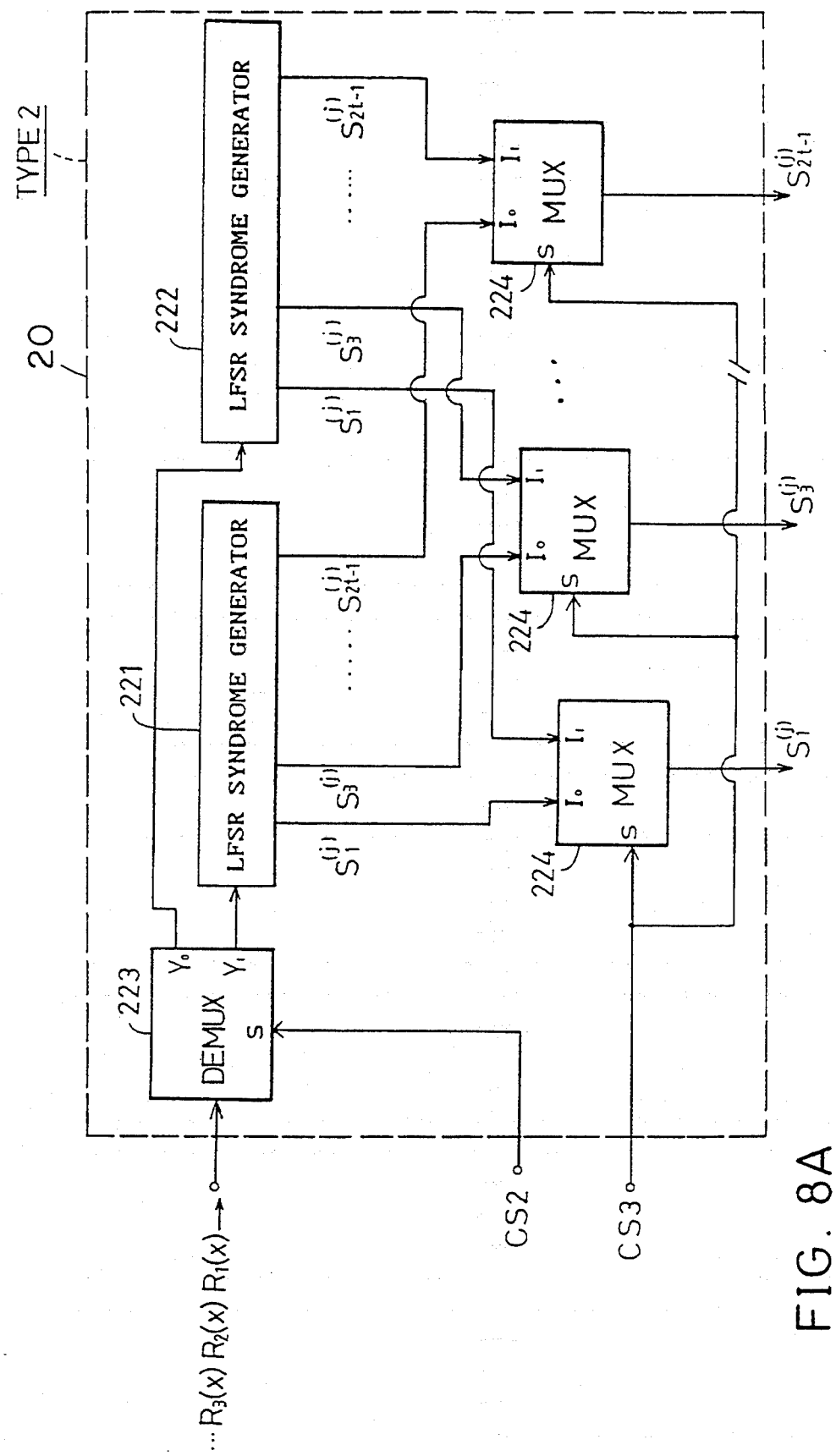
FIG. 8A is a schematic block diagram, showing the second embodiment (TYPE 2) of a syndrome generating module utilized in the BCH decoder of FIG. 6.

As shown in FIG. 8A, the TYPE 2 configuration of the syndrome generating module 20 comprises a first LFSR (linear feedback shift register) syndrome generator 221, a second LFSR syndrome generator 222, a demultiplexer 223, and an array of t multiplexer 224. The first LFSR syndrome generator 221 is identical in structure to the second LFSR syndrome generator 222. The structure of an LFSR circuit for generating syndrome values is first proposed by Peterson.

A control sequence $CS_2$, where $$CS_2 = (1^n, 0^n)_{2n}^0$$

is employed for the selection of the demultiplexer 223. When a bit 0 in $CS_2$ is present, the demultiplexer 223 allows an input signal to be transmitted via the output port $Y_0$; otherwise when a bit 1 in $CS_2$ is present, the input signal is to be transmitted via the output port $Y_1$. Consequently, as a series of binary words $R_1(x)$, $R_2(x)$, $R_3(x)$, $R_4(x)$ . . . are received, the control sequence $CS_2$ presents periodically n consecutive bits of 1 and then n consecutive bits of 0 and whereby the demultiplexer 223 transmits the first received n bits which constitutes $R_1(x)$, to the first LFSR syndrome generator 221, and then the next received n bits, which constitutes $R_2(x)$, to the second LFSR syndrome generator 222, and so forth. Accordingly, the received words $R_1(x)$, $R_3(x)$, $R_5(x)$, . . . are processed by the first LFSR syndrome generator 221; and the received words $R_2(x)$, $R_4(x)$, $R_6(x)$, . . . are processed by the second LFSR syndrome generator 222.

The time required by one LFSR syndrome generator in the process for generating the group of syndromes $\{S_1^{(0)}, S_3^{(0)}, \ldots, S_{2t-1}^{(0)}\}$ a received word $R(x)$ is n clock cycles. During each of the subsequent $n-1$ clock cycles, the LFSR syndrome generator shifts the bits stored in its registers once to obtain one of the sets of the syndromes $\{S_1^{(j)}, S_3^{(j)}, \ldots, S_{2t-1}^{(j)}\}$, $1 \leq j \leq n-1$.

Accordingly, in order to boost up the overall processing speed, at the instant the first LFSR syndrome generator 221 accomplishes the generation of the syndromes $\{S_1^{(0)}, S_3^{(0)}, \ldots, S_{2t-1}^{(0)}\}$, the second received word $R_2(x)$ is sent into the second LFSR syndrome generator 222. In this way, the generating of the syndromes $\{S_1^{(0)}, S_3^{(0)}, \ldots, S_{2t-1}^{(0)}\}$ of the second received word $R_2(x)$ and the shifted syndromes $(S_1^{(j)}, S_3^{(j)}, \ldots, S_{2t-1}^{(j)}\}$, $1 \leq j \leq n-1$ of the first received word $R_1(x)$ are performed simultaneously.

An array of t multiplexers 224 having the selection thereof controlled by a control sequence $CS_3$, where $$CS_3(1^n, 0^n)_{2n}^{d_3},$$

are used for the selection between the outputs of the first LFSR syndrome generator 221 and the outputs of the second LFSR syndrome generator 222. The control sequence $CS_3$ also presents a sequence of n consecutive bits of 1 and n consecutive bits of 0 in a period of 2n as the control sequence $CS_2$ except for the delay $d_3$ which is the latency of each of the LFSR syndrome generators. The control sequence $CS_3$ can therefore be provided by coupling a series of $d_3$ latches (not shown) between $CS_2$ and the input.

Figure 8B:
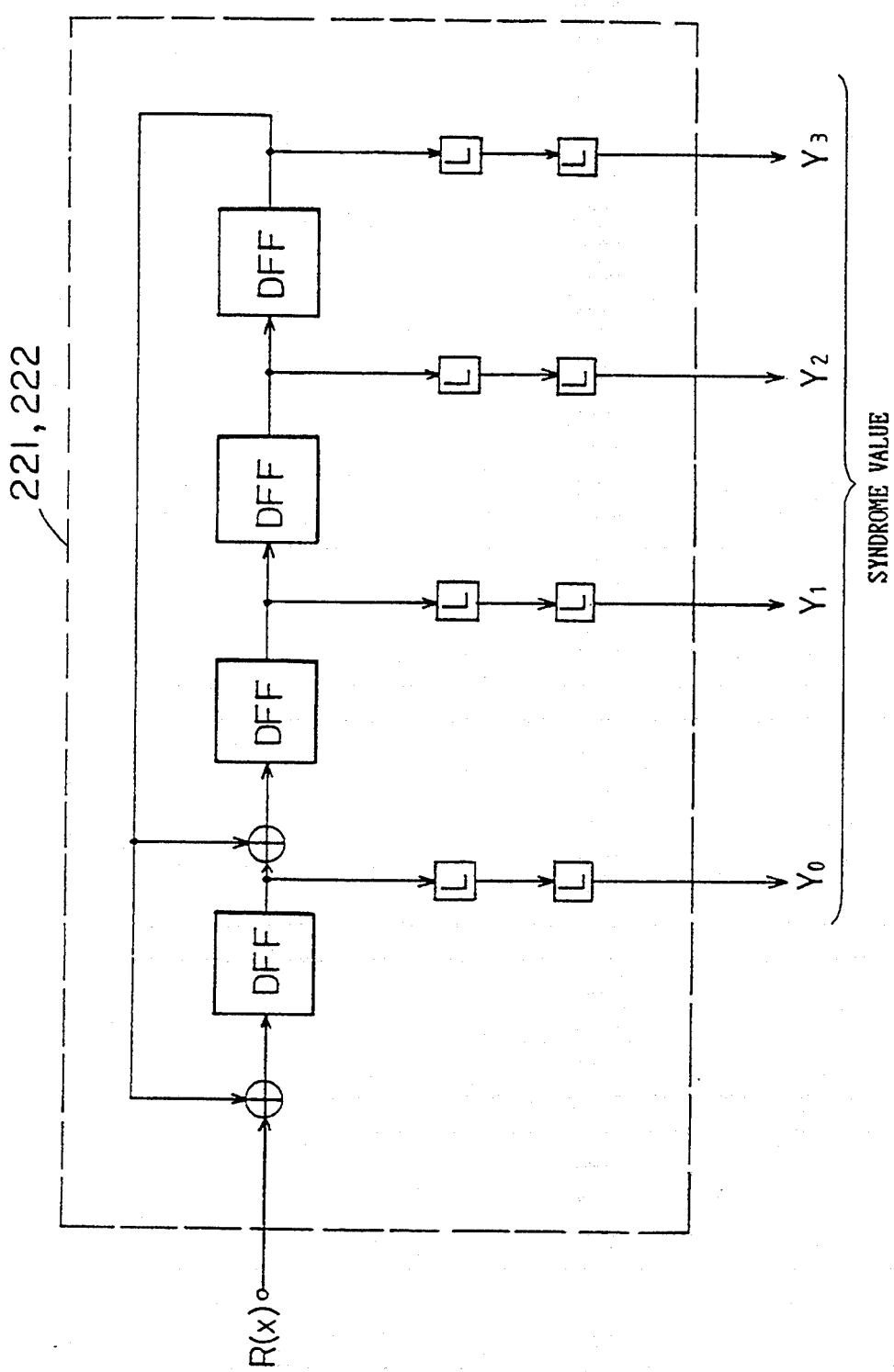
FIG. 8B shows the configuration of a LFSR utilized for generating the syndrome $S_1^{(j)}$ in a double-error-correcting (15,7,51) BCH decoder.
Figure 8C:
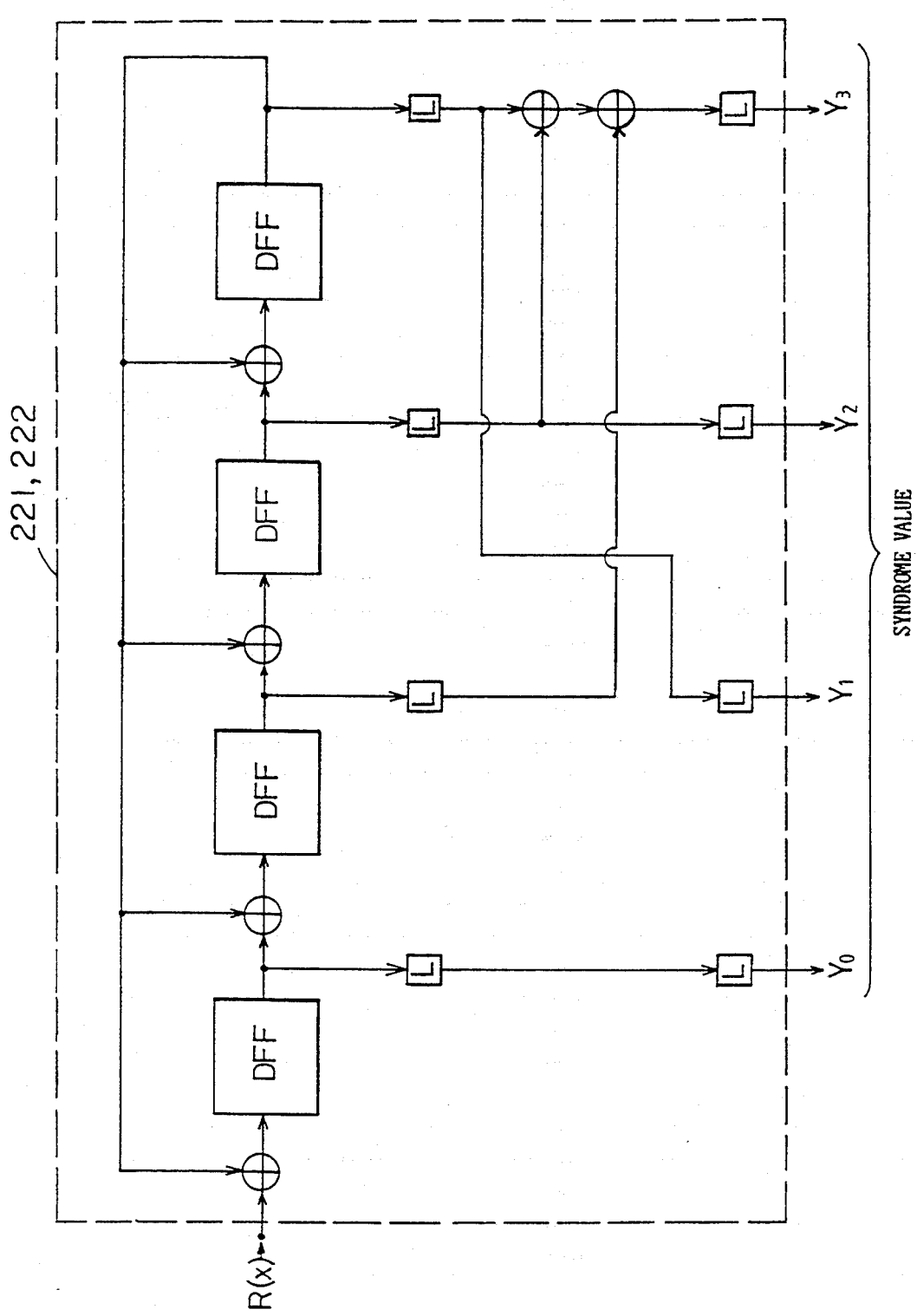
FIG. 8C shows the configuration of a LFSR utilized for generating the syndrome $S_3^{(j)}$ in a double-error-correcting (15,7,51) BCH decoder.

In a BCH decoder for the decoding of (15,7,5) BCH codewords, i.e. t=2, the configuration of a LFSR cell used in the LFSR syndrome generator for generating the syndromes $S_1^{(j)}$, $j=0,1,2,\ldots,n-1$ is show in FIG. 8B; and the same for generating the syndromes $S_3^{(j)}$, $j=0,1,2,\ldots,n-1$ is shown in FIG. 8C. The configuration for the circuits of FIG. 8B and FIG. 8C is a conventional technique and therefore for a detailed understanding thereof readers should direct to a textbook *"ERROR CONTROL CODING: FUNDAMENTAL AND APPLICATIONS"* authored by Shu Lin & D. J. Costello, Jr. and published by Prentice Hall, in Chapter 6, Section 6.3.

TYPE 3 of the Syndrome Generating Module 20

Figure 9A:
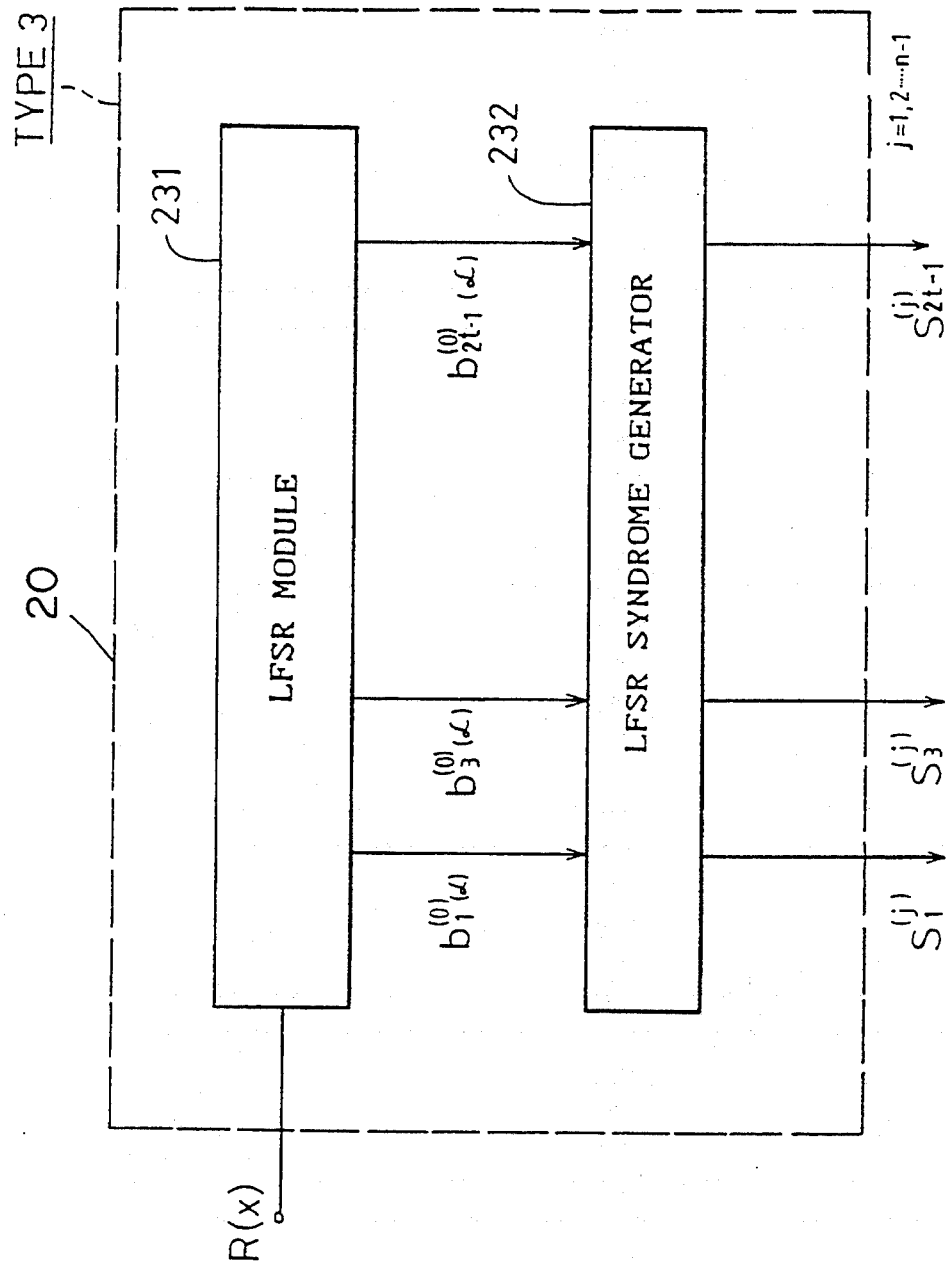
Figure 9B:
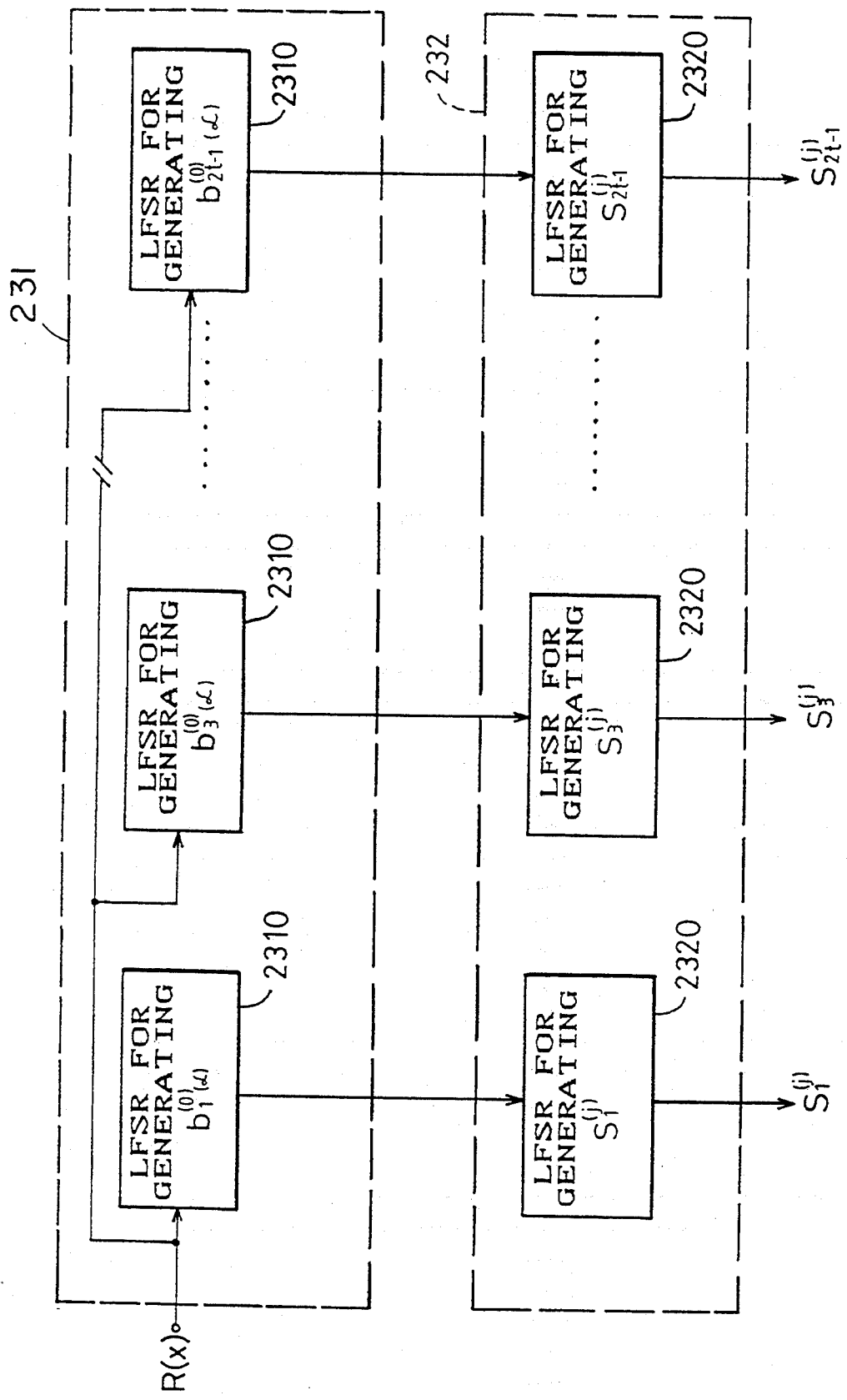
FIG. 9B shows the detailed configuration of the block diagram of FIG. 9A.
Figure 9C:
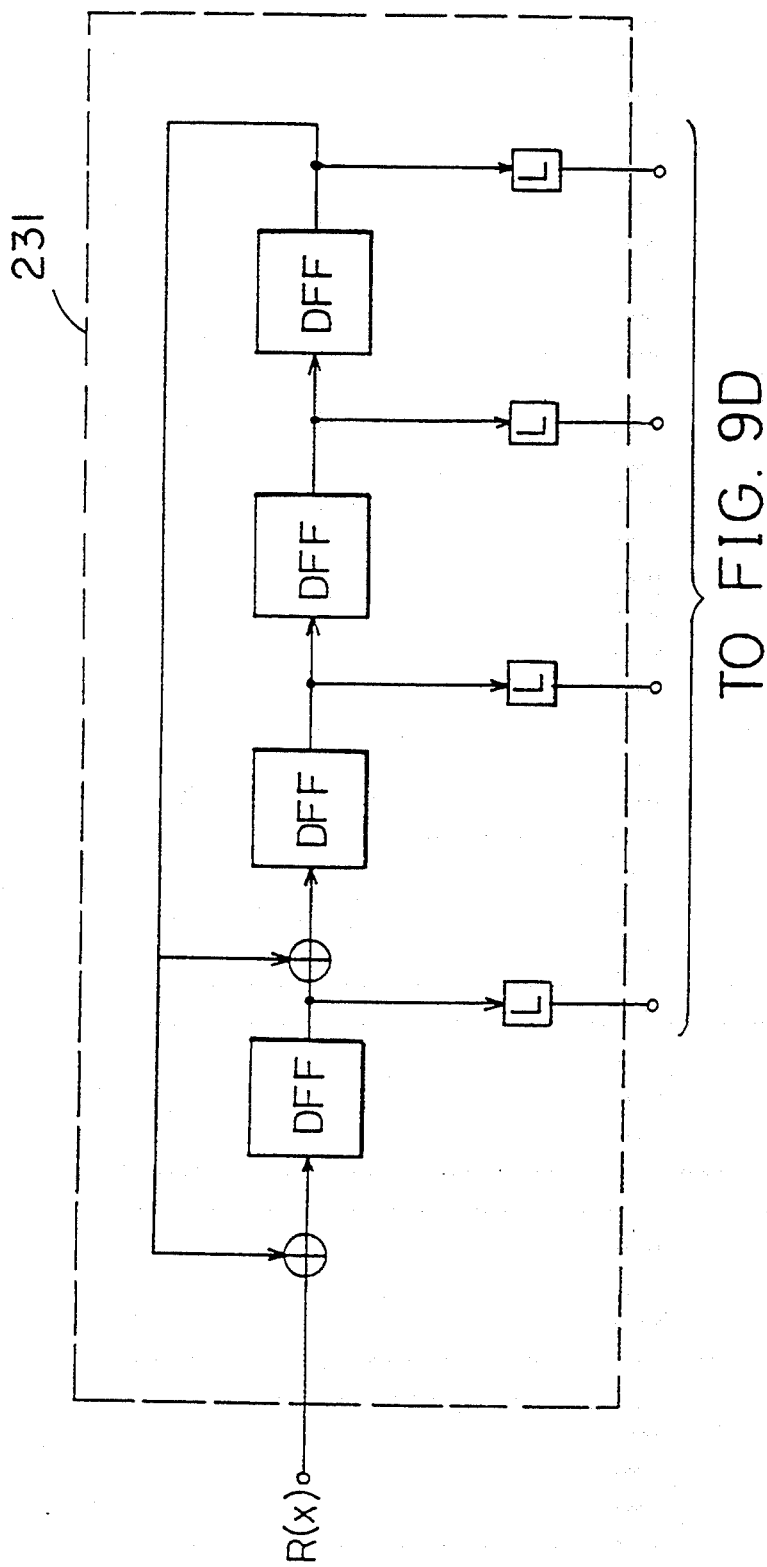
FIG. 9C shows a circuit used for generating $b_1^{(0)}(\alpha)$ in the decoding of (15,7,5) BCH codewords and utilized in the circuit of FIG. 9A.

Referring to FIGS. 9A–9C, the TYPE 3 configuration of the syndrome generating module 20 substantially comprises the same elements, i.e. two modules each of which comprises an array of t LFSR circuit as those utilized in the TYPE 2 configuration except that herein the two modules are connected in series and with a slight modification in the configuration of the LFSR circuit.

As shown in FIGS. 9A–9B, the TYPE 3 syndrome generator comprises a LFSR module 231 and an LFSR syndrome generator 232. As the first received word $R_1(x)$ is received, the LFSR module 231 is employed for generating a group of the values $\{b_1^{(0)}(\alpha), b_3^{(0)}(\alpha), \ldots, b_{2t-1}^{(0)}(\alpha)\}$, where $$b_i^{(0)}(\alpha) = \text{Mod}\left\{ \frac{R_1(x)}{M_i(x)} \right\}\bigg|_{x=\alpha} = b_{i,0} + b_{i,1} \cdot \alpha +$$

$$b_{i,1} \cdot \alpha^2 + \ldots + b_{i,m-1} \cdot \alpha^{m-1}$$

for $i=1,3,\ldots 2t-1$; and the LFSR syndrome generator 232 is capable of generating the syndromes $\{S_1^{(0)}, S_2^{(0)}, \ldots, S_{2t}^{(0)}\}$ and the syndromes $\{S_1^{(j)}, S_2^{(j)}, \ldots, S_{2t}^{(j)}\}$ for $j=1,2,\ldots n-1$ in accordance with the values $\{b_1^{(0)}(\alpha), b_3^{(0)}(\alpha), \ldots, b_{2t-1}^{(0)}(\alpha)\}$.

As shown in FIG. 9B, the LFSR module 231 consists of an array of t first LFSR circuits 2310, each of which is used for the generation of one of the values $\{b_1^{(0)}(\alpha), b_3^{(0)}(\alpha), \ldots, b_{2t-1}^{(0)}(\alpha)\}$; and the LFSR syndrome generators 232 consists of an array of t second LFSR circuit 2320.

Figure 9D:
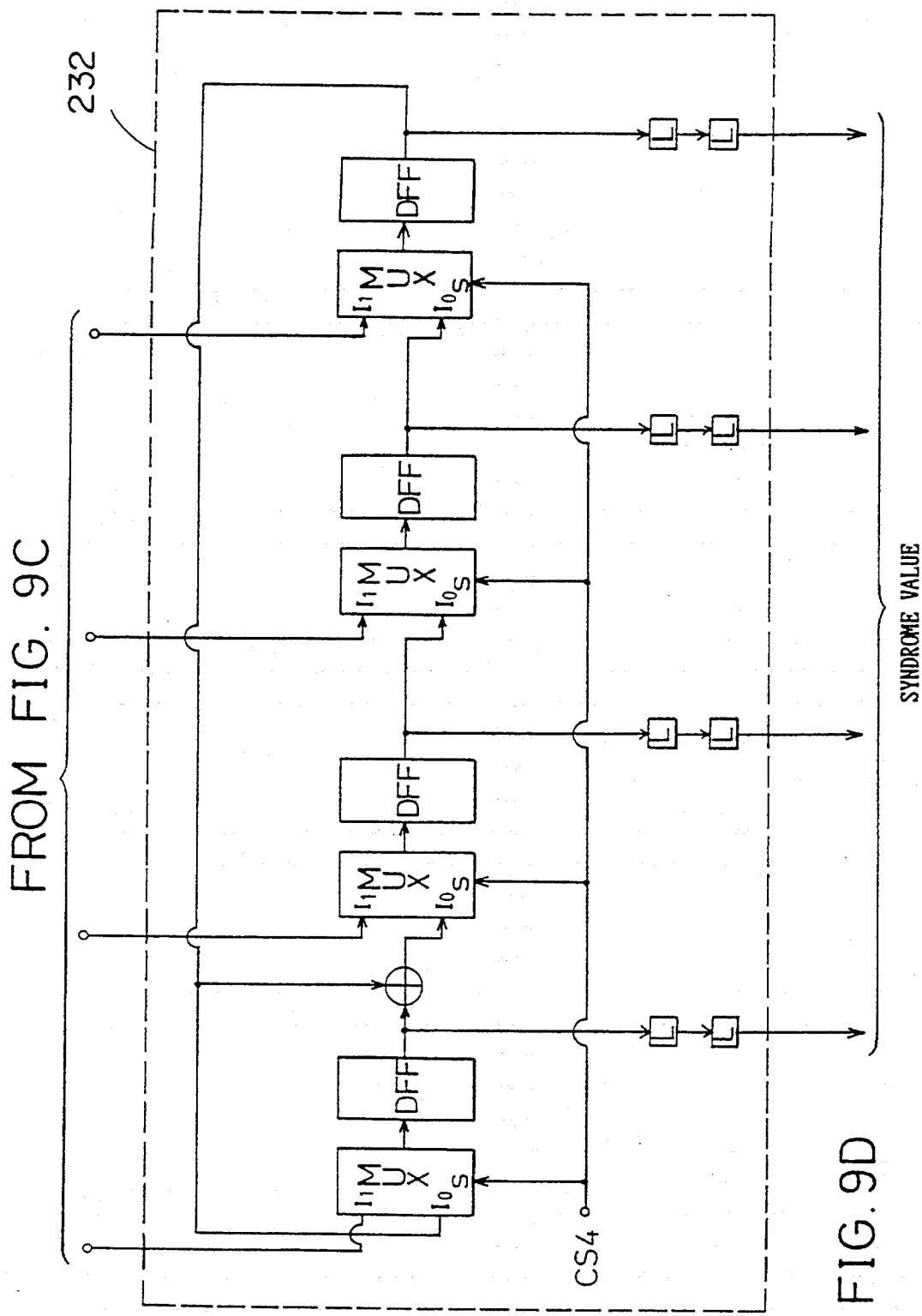
FIG. 9D shows a circuit used for generating $S_1^{(j)}$ in the decoding of (15,7,5) BCH codewords and utilized in the circuit of FIG. 9A.
Figure 9E:
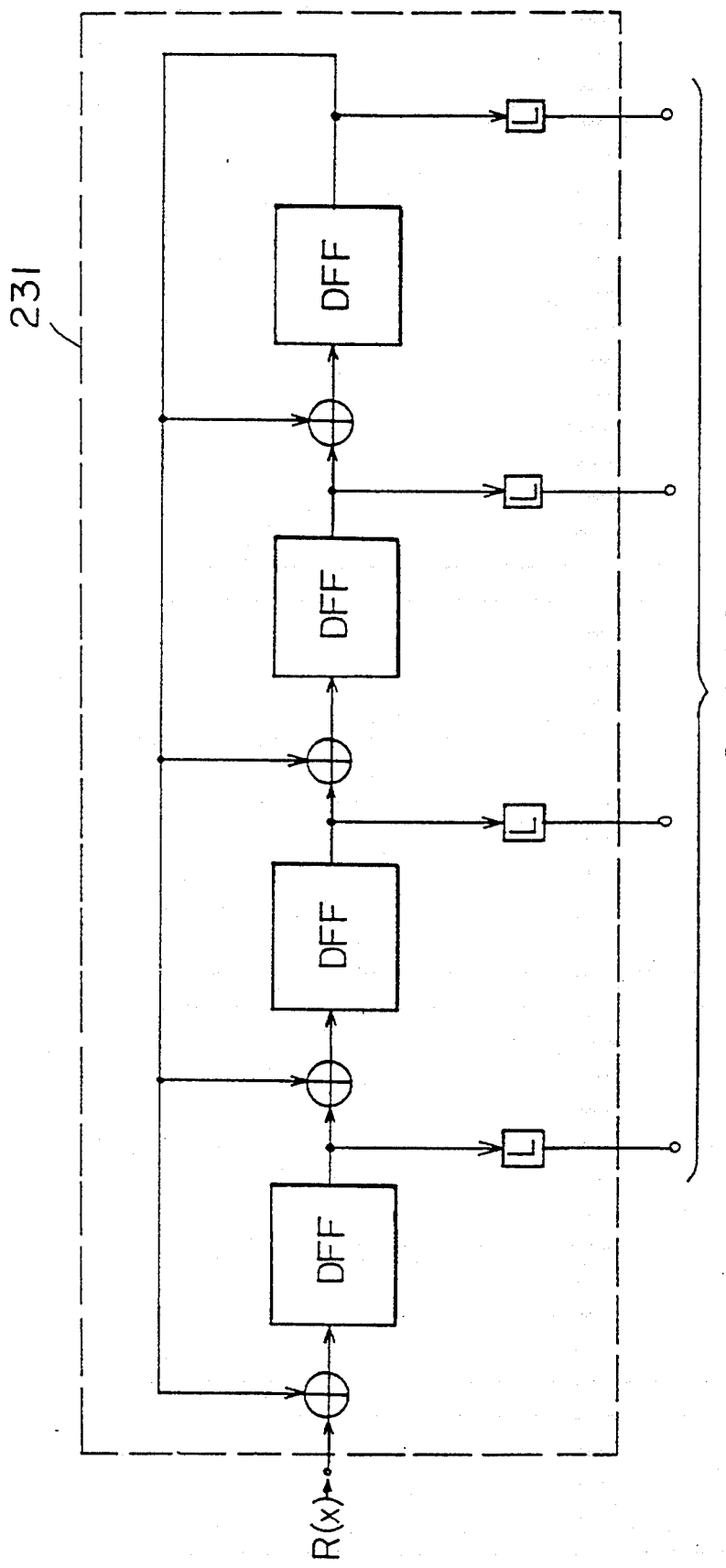
Figure 9F:
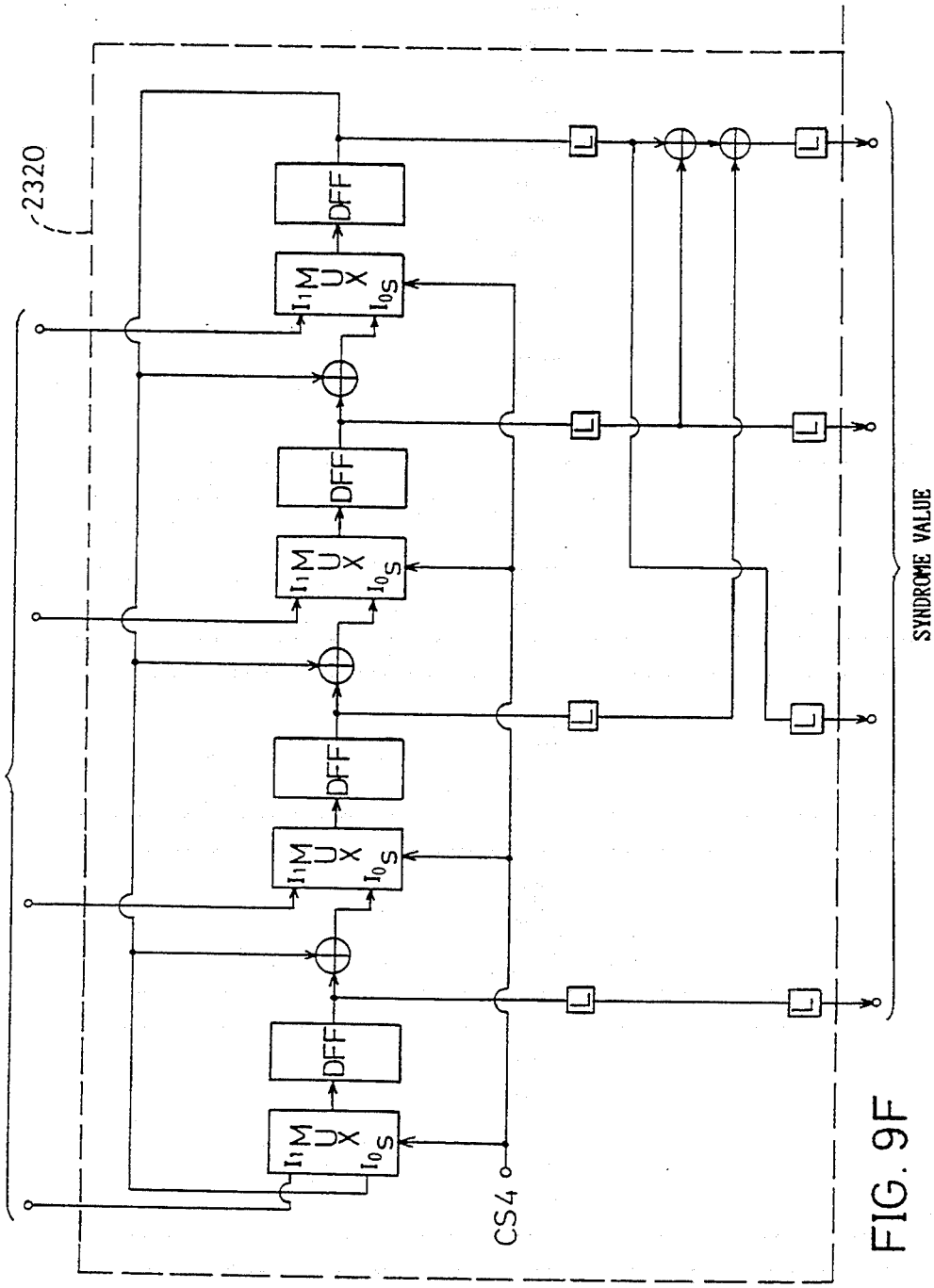
FIG. 9F shows a circuit used for generating $S_3^{(j)}$ in the decoding of (15,7,5) BCH codewords and utilized in the circuit of FIG. 9A.

Taking the case of a double-error-correcting (15,7,5) BCH decoder as an example, an LFSR circuit for generating $b_1^{(0)}(\alpha)$ is shown in FIG. 9C and an LFSR circuit for generating $b_3^{(0)}(\alpha)$ is shown in FIG. 9E. Further, an LFSR circuit, which is coupled to the output of the $b_1^{(0)}(\alpha)$ generating LFSR circuit of FIG. 9C, for generating $S_1^{(0)}$ and $S_1^{(j)}$, $j=1,2,\ldots,n-1$ is shown in FIG. 9D; and an LFSR circuit which is coupled to the output of the $b_3^{(0)}(\alpha)$ generating LFSR circuit of FIG. 9E, for generating $S_3^{(0)}$ and $S_3^{(j)}$, $j=1,2,\ldots,n-1$ is shown in FIG. 9F. For the detailed description and understanding of the four LFSR circuits, reference can be made to the above-mentioned textbook *"ERROR CONTROL CODING: FUNDAMENTAL AND APPLICATIONS"*.

The configurations of the first LFSR circuits 2310 and the second LFSR circuit 2320 are essentially employed from the conventional techniques described in the textbook. Although, in the configuration of the second LFSR circuit 2320, there is provided with a plurality of multiplexers MUX controlled by a control sequence $CS_4$, where $$CS_4 = (1, 0^{14})_{15}^{d_4}.$$

During the clock cycle when $CS_4$ present the bit 1, the bits stored in the D-type flip-flops DFF shown in FIG. 9C and FIG. 9E are transferred via the multiplexers MUX to the D-type flip-flops DFF shown in FIG. 9D and FIG. 9F. At the same time, the outputs of the D-type flip-flops DFF shown in FIG. 9D and FIG. 9F are the syndrome values $S_1^{(0)}$ and $S_3^{(0)}$. During the subsequent $n-1$ clock cycles, the control sequence $CS_4$ presents $n-1$ consecutive bit 0 and therefore during each clock cycle of this time a shift is made in the four D-type flip-flops DFF both of FIG. 9D and FIG. 9F. Each shift operation causes the output of each of the syndrome groups $\{S_1^{(j)}, S_3^{(j)}\}$, $j=1,2,\ldots n-1$.

During the same time the circuits of FIG. 9D and FIG. 9E are engaged in the generating of the syndrome values of the first received word $R_1(x)$, the circuits of FIG. 9C and FIG. 9E are also engaged in the generating of the values $\{b_1^{(0)}(\alpha), b_3^{(0)}(\alpha), \ldots, b_{2t-1}^{(0)}(\alpha)\}$ of the second received word $R_2(x)$. At the instant the circuits of FIG. 9D and FIG. 9F complete the delivering of the syndromes $\{S_1^{(n-1)}, S_3^{(n-1)}, \ldots, S_{2t-1}^{(n-1)}\}$ of the first received word $R_1(x)$, the circuits of FIG. 9C and FIG. 9E also complete the generating of the values $\{b_1^{(0)}(\alpha), b_3^{(0)}(\alpha), \ldots, b_{2t-1}^{(0)}(\alpha)\}$ of the second received word $R_2(x)$ and therefore the control sequence $CS_4$ again presents a bit 1 to the multiplexers MUX such that the values $\{b_1^{(0)}(\alpha), b_3^{(0)}(\alpha), \ldots, b_{2t-1}^{(0)}(\alpha)\}$ are transferred to the circuits of FIG. 9C and FIG. 9E and the third received word $R_3(x)$ is received by the circuits of FIG. 9C and FIG. 9E, and so forth.

The Comparison Circuit 30

Accordingly with the foregoing configurations, the syndrome generating module 20 sends out each one of the n groups of syndrome values:

$\{S_1^{(0)}, S_3^{(0)}, \ldots, S_{2t-1}^{(0)}\}$,
$\{S_1^{(1)}, S_3^{(1)}, \ldots, S_{2t-1}^{(1)}\}$, and
$\{S_1^{(n-1)}, S_3^{(n-1)}, \ldots, S_{2t-1}^{(n-1)}\}$, one clock cycle after the other to the comparison circuit 30.

Figure 10:
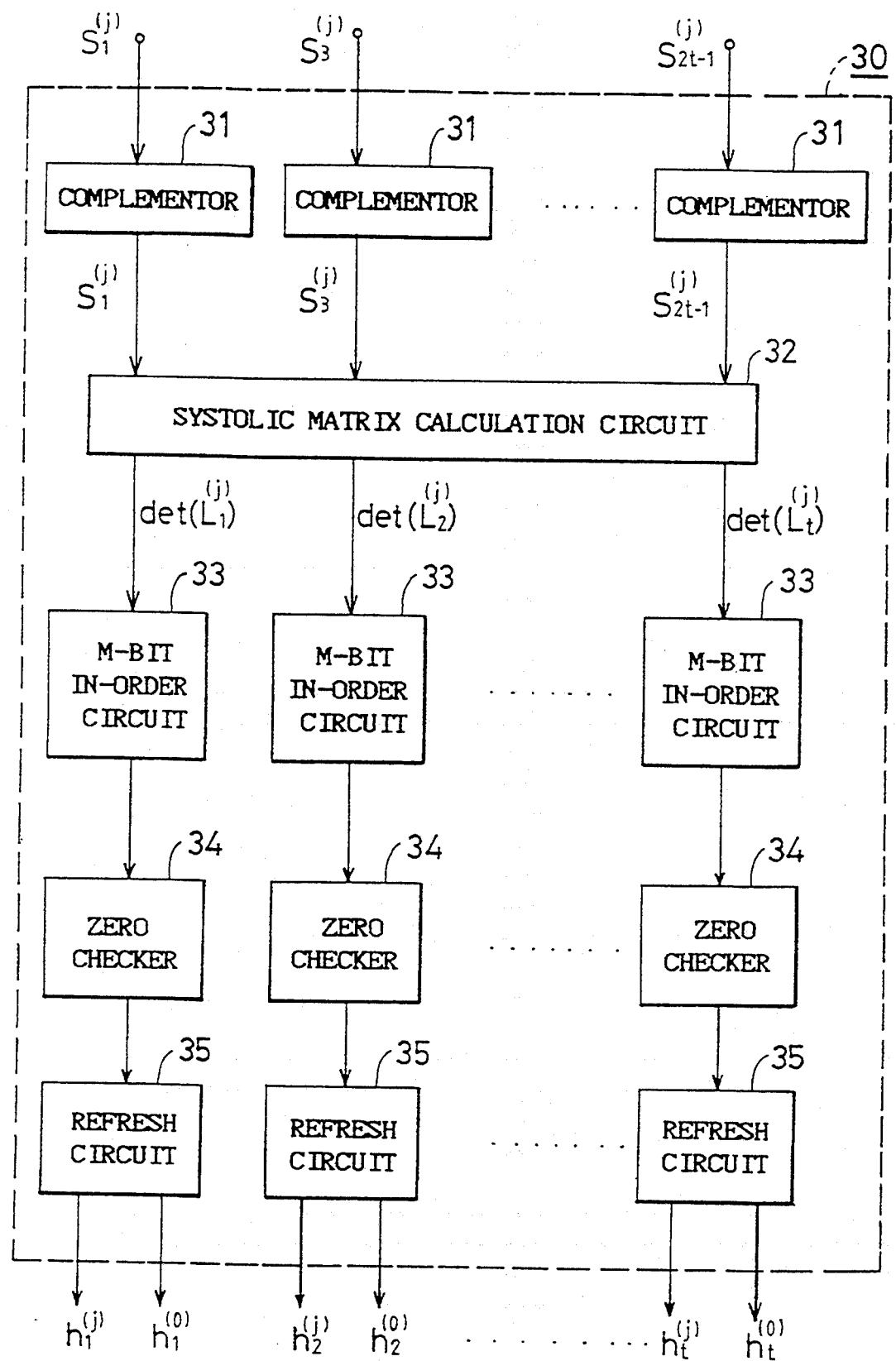
FIG. 10 shows the block diagram of a comparison module utilized in the BCH decoder of FIG. 6.

Referring to FIG. 10, there is shown the block diagram of the comparison circuit 30, which comprises an array of t complementors 31, a systolic matrix calculation circuit 32, an array of t m-bit in-order circuits 33, an array of t zero checkers 34, and an array of t refresh circuits 35.

As one of the groups of the syndrome values $[S_1^{(j)}, S_3^{(j)}, \ldots, S_{2t-1}^{(j)}], j=0,1,2,\ldots,n-1$ enters the comparison circuit 30, the t complementors 31 are employed for performing the operations:

(1) when the syndromes $\{S_1^{(0)}, S_3^{(0)}, \ldots, S_{2t-1}^{(0)}\}$ are received, no operation is performed such that the syndromes $\{S_1^{(0)}, S_3^{(0)}, \ldots, S_{2t-1}^{(0)}\}$ are sent directly to the systolic matrix calculation circuit 32; and (2) when the syndromes $[S_1^{(j)}, S_3^{(j)}, \ldots, S_{2t-1}^{(j)}]$, $j=1,2,\ldots,n-1$ are received, the following operation is performed:

$\underline{S_i^{(j)}} = S_i^{(j)} + 1$ for $i=1,3,\ldots,2t-1$ and $1 \leq j \leq n-1$.

Figure 11:
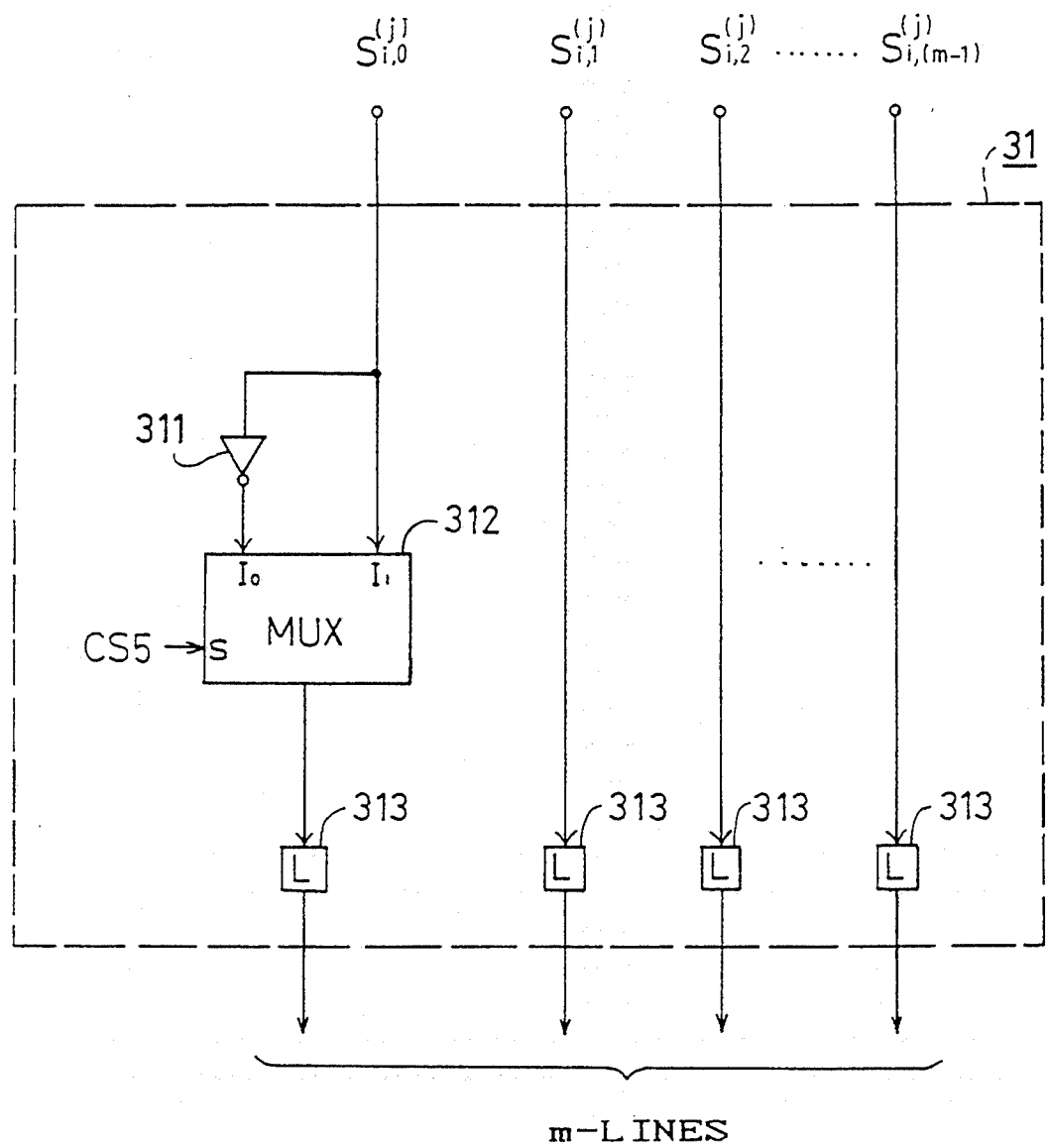
FIG. 11 shows the configuration of a complementor circuit.

In accordance with the above two conditions, the configuration of each of the t complementors 31 is shown in FIG. 11, which comprises an inverter 311, a 2-to-1 multiplexer 312, and an array of m one-bit latches 313. The selection of the two inputs $I_0$ and $I_1$ as the output of the multiplexer 312 is controlled by a selection bit. A control sequence $CS_5$, where $CS_5 = (1, 0^{n-1})_n^{d_5}$, is used for the selection of $I_0$ or $I_1$ during separate clock cycles. The determination of the delay value $d_5$ is decided by the latencies of the preceding modules and which should allow the first bit in $CS_5$ to be presented to the multiplexers 312 when the first group of the syndromes $\{S_1^{(0)}, S_3^{(0)}, \ldots, S_{2-1}^{(0)}\}$ are received in. For example, if TYPE 1 syndrome generating module is employed, $d_5$ is equal to $3m-1$.

When the first group of syndromes $\{S_1^{(0)}, S_3^{(0)}, \ldots, S_{2t-1}^{(0)}\}$ are received, since the first bit in $CS_5$ is present, the lowest order bit of each of the syndromes $\{S_1^{(0)}, S_3^{(0)}, \ldots, S_{2t-1}^{(0)}\}$ passes directly to the latch 313 coupled to the output of the multiplexer 312. As a result, the whole group of the syndromes $\{S_1^{(0)}, S_3^{(0)}, \ldots, S_{2t-1}^{(0)}\}$ are passed directly without being changed to the matrix calculation circuit 32.

During the subsequent $n-1$ clock cycles, since the bit presented by $CS_5$ are all 0s, the latch 313 coupled to the output of the multiplexer 312 receives a bit which is the complement of the lowest order bit $S_{i,0}^{(j)}$ of each of the syndromes $\{S_1^{(j)}, S_3^{(j)}, \ldots, S_{2t-1}^{(j)}\}, j=1,2,\ldots,n-1$. As a result, the outputs of the array of the t complementors 31 are the syndromes $\{\underline{S_1^{(j)}}, \underline{S_3^{(j)}}, \ldots, \underline{S_{2t-1}^{(j)}}\}, j=1,2,\ldots,n-1$.

The Matrix Calculation Circuit 32

The systolic matrix calculation circuit 32 is employed for the calculation of the determinants of the syndrome matrices. When the first group of syndromes $\{S_1^{(0)}, S_3^{(0)}, \ldots, S_{2t-1}^{(0)}\}$ are received, the outputs of the systolic matrix calculation circuit 32 are $\{\det(L_1^{(0)}), \det(L_2^{(0)}), \ldots, \det(L_t^{(0)})\}$; and the inputs are the syndromes $\{\underline{S_1^{(j)}}, \underline{S_3^{(j)}}, \ldots, \underline{S_{2t-1}^{(j)}}\}, j=1,2,\ldots,n-1$, the outputs are $\{\det(\underline{L_1^{(j)}}), \det(\underline{L_2^{(j)}}), \ldots, \det(\underline{L_t^{(j)}})\} j=1,2,\ldots,n-1$.

Two exemplary examples of the matrix calculation circuit 32 will be given respectively for the case of $t=2$ and for the case of $t=3$.

EXAMPLE: The Matrix Calculation Circuit 32 for $t=2$

Figure 12:
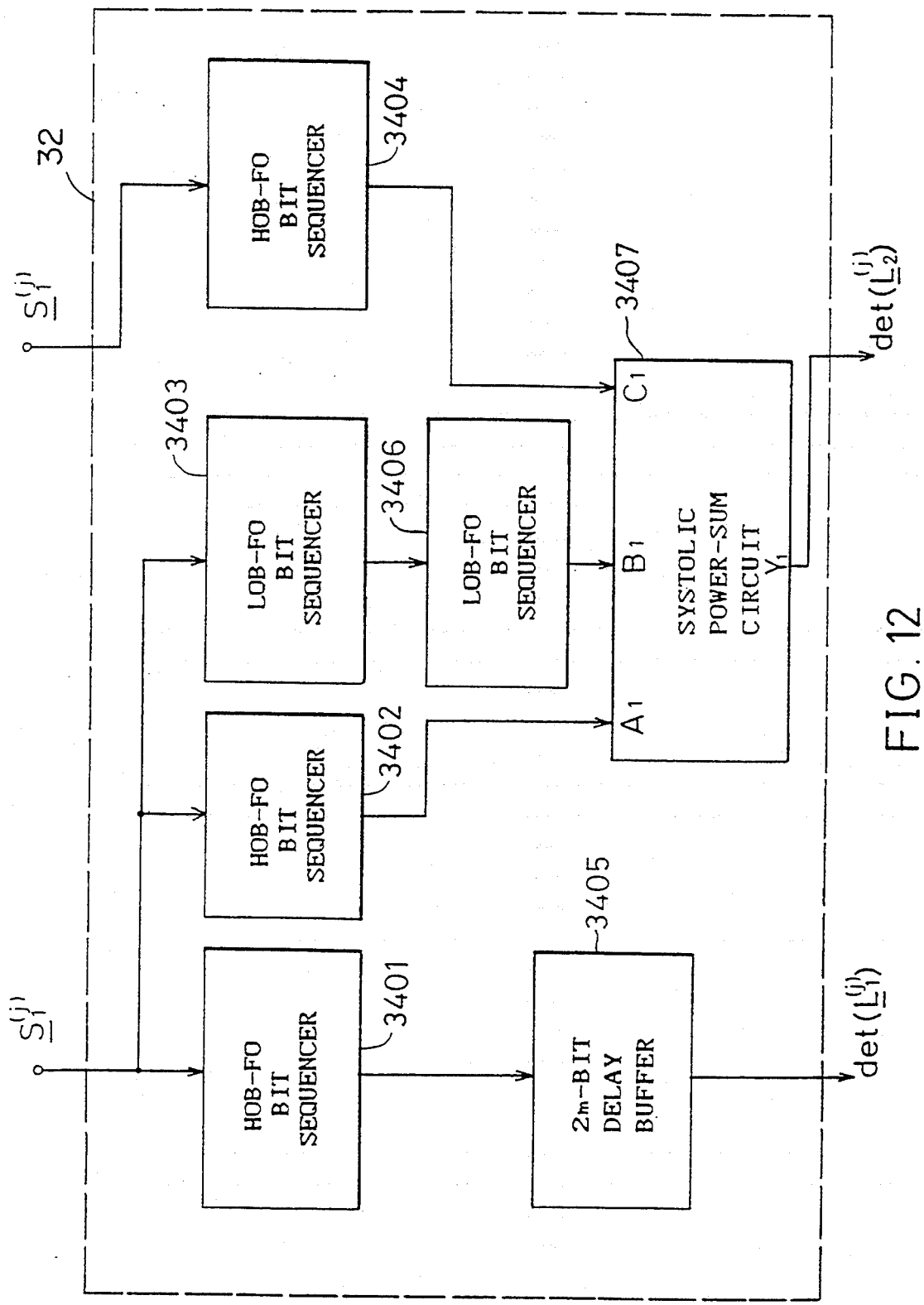
FIG. 12 shows the block diagram of a matrix calculation circuit utilized in a double-error-correcting (t=2) BCH decoder.

For the case of a double-error-correcting BCH decoder, $L_1^{(j)} = S_1^{(j)}$ and $L_2^{(j)} = \begin{bmatrix} S_1^{(j)} & 1 \\ S_3^{(j)} & S_2^{(j)} \end{bmatrix}$ and therefore $\det(L_1^{(j)}) = S_1^{(j)}$ $\det(L_2^{(j)}) = S_1^{(j)} \cdot S_2^{(j)} + S_3^{(j)}$ $= S_1^{(j)} \cdot (S_1^{(j)})^2 + S_3^{(j)}$ $= (S_1^{(j)})^3 + S_3^{(j)}$ The configuration of a matrix calculation circuit utilized for performing the above two arithmetic operations in $GF(2^m)$ is shown in FIG. 12. The circuit of FIG. 12 utilizes a systolic power-sum circuit 3407 which is a Galois Field arithmetic processing unit capable of taking three $GF(2^m)$ elements $A_1$, $B_1$, and $C_1$ as the inputs and delivers an output $Y_1 = A_1 \cdot (B_1)^2 + C_1$.

For a more detailed understanding of the function and structure of the systolic power-sum circuit 3407, readers should refer to a technical paper entitled "*A Systolic Power-Sum Circuit for GF($2^m$)*" by Dr. S. W. Wei, the co-inventor of the present invention, and which is published on "*Proceedings of International Symposium on Communications*", pp.61–64, 1991.

The 2m-bit buffer delay 3405 is configured by a plurality of latches connected latches (not shown) connected in series. The configuration of each of the LOB- FO bit sequencers 3403, 3406 is the same as that shown in FIG. 7D; and that of the HOB-FO bit sequencers 3401, 3402, 3404 is the same as that shown in FIG. 7E.

EXAMPLE: The Matrix Calculations Circuit 32 for $t=3$

For the case of a triple-error-correcting BCH decoder, $$L_1^{(j)} = S_1^{(j)}$$

$$L_2^{(j)} = \begin{bmatrix} S_1^{(j)} & 1 \\ S_3^{(j)} & S_2^{(j)} \end{bmatrix}$$

and $$L_3^{(j)} = \begin{bmatrix} S_1^{(j)} & 1 & 0 \\ S_3^{(j)} & S_2^{(j)} & S_1^{(j)} \\ S_5^{(j)} & S_4^{(j)} & S_3^{(j)} \end{bmatrix}$$

and therefore $$\det(L_3^{(j)}) = S_1^{(j)} \cdot S_2^{(j)} \cdot S_3^{(j)} + S_1^{(j)} S_5^{(j)} + (S_1^{(j)})^2 \cdot S_4^{(j)} + (S_3^{(j)})^2 =$$

$$(S_1^{(j)})^3 \cdot S_3^{(j)} + S_1^{(j)} \cdot S_5^{(j)} + (S_1^{(j)})^6 + (S_3^{(j)})^2 =$$

$$[(S_1^{(j)})^3 + S_3^{(j)}]^2 + [(S_1^{(j)})^2 \cdot S_3^{(j)} + S_5^{(j)}] \cdot S_1^{(j)}$$

Figure 13:
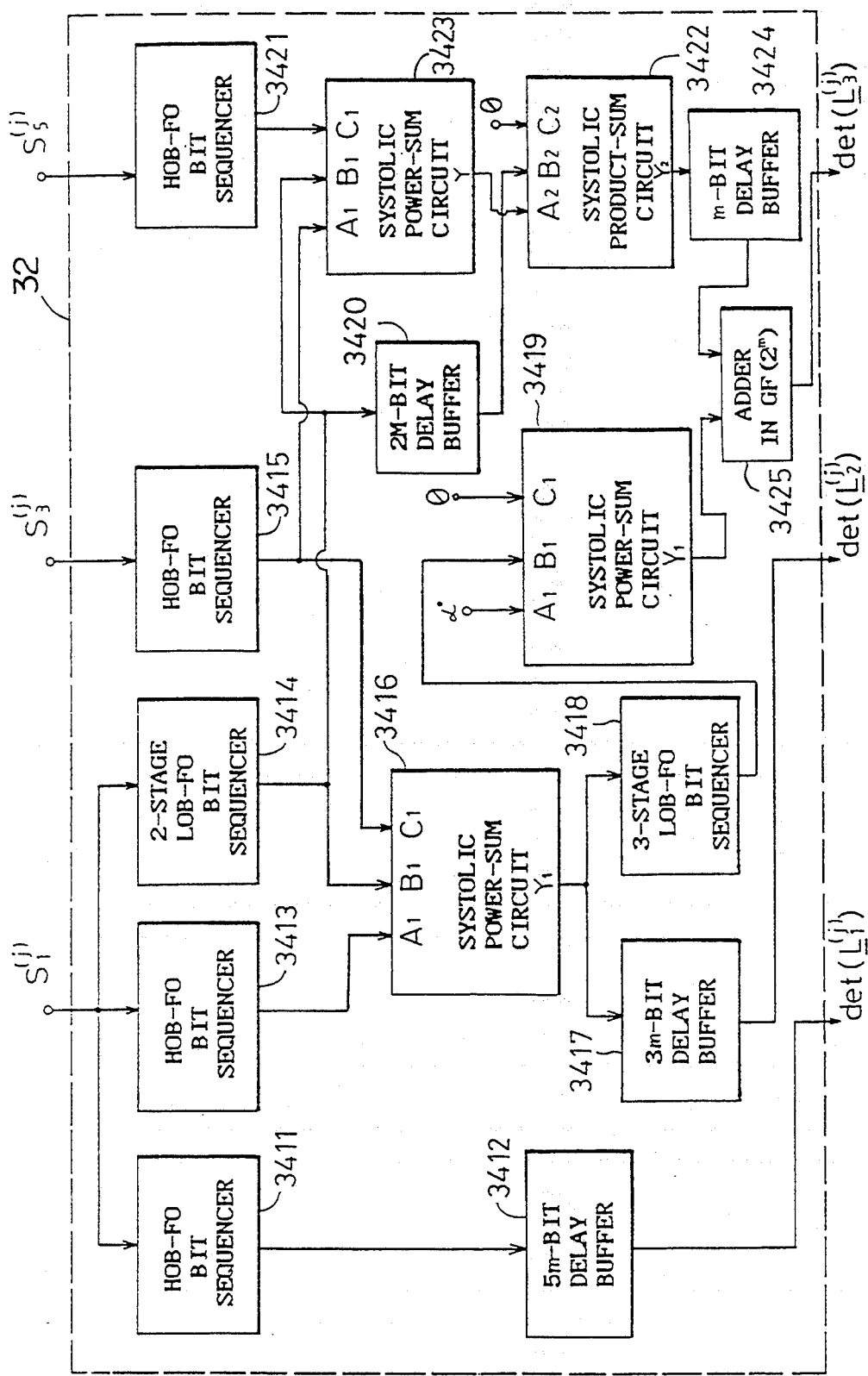
FIG. 13 shows the schematic diagram of a matrix calculation circuit utilized in a triple-error-correcting (t=3) BCH decoder.

The configuration of a matrix calculation circuit utilized for performing the above three arithmetic operations in $GF(2^m)$ is shown in FIG. 13. The circuit of FIG. 12 essentially comprises a first systolic power-sum circuit 3416, a second systolic power-sum circuit 3419, a third systolic power-sum circuit 3423, a systolic product-sum circuit 3422 and a $GF(2^m)$ adder 3425. The structures of the three systolic power-sum circuits are the same as that described in the foregoing case of $t=2$ and readers should turn to the aforementioned technical paper for the technical grounds for the coupling of the bit sequencer circuits 3411, 3413, 3414, 3415, 3418, 3421, and 3424. The delayed bits of the delay buffer 3412, 3417, 3420, and 3424 are given in such ways that the output of the determinant values $\det(L_1^{(j)})$, $\det(L_2^{(j)})$, and $\det(L_3^{(j)})$ are synchronized.

The systolic product-sum circuit is also a Galois Field arithmetic processor capable of taking three $GF(2^m)$ elements $A_2$, $B_2$, and $C_2$ as the inputs and delivers an output $Y_2 = (A_2 \cdot B_2) + C_2$. The construction of the systolic product-sum circuit 3422 is a conventional technique and thus no detail of the structure thereof will be described.

The In-order circuit 33

Since it is an intrinsic characteristic of the systolic matrix calculation circuit 32 that only one bit of the binary representation of $\det(L_p^{(j)})$ is output during one clock cycle, i.e. one bit after the other beginning from the highest order bit to the lowest order bit. As a result, an in-order circuit 33 has to be coupled between the output of the systolic matrix calculation circuit 32 and the input of the zero checker 34 such that the m bits constituting each determinant values are delivered at the same time in parallel to the zero checker 34. The configuration of the in-order circuit 33 is the same as the LOB-FO bit sequencer shown in FIG. 7D, wherein the line where the highest-order bit is sent out is arranged with $m-1$ latches, and the line where the subsequent bit is sent out is arranged with $m-2$ latches, and so forth. The line where the lowest-order bit is sent out is arranged without any latches. With such arrangement, the m bits representing one determinant value can be received by the zero checker 34 in parallel at the same time.

The Zero-checking Circuit 34

The zero-checking circuit 34 is a logic circuit which is employed for checking if each of the values of the determinants $\{\det(L_1^{(j)}), \det(L_2^{(j)}), \ldots, \det(L_t^{(j)})\}$ is zero or not. If zero, a bit of $Zc=1$ will be sent out; and if not zero, a bit of $Zc=0$ will be sent out.

Figure 14:
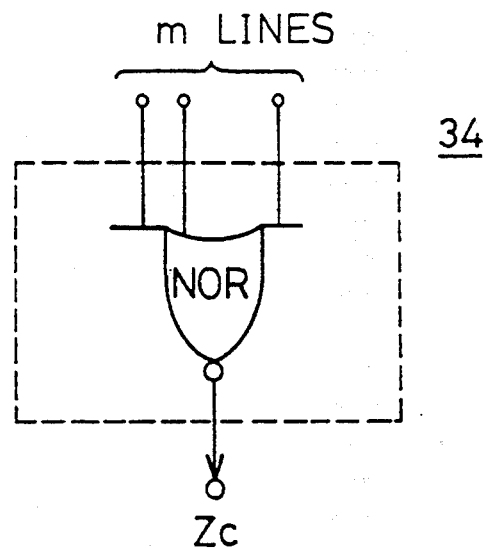
FIG. 14 shows the configuration of a zero-checking circuit.

As shown in FIG. 14, the zero-checking circuit 34 can be easily implemented by using an m-input NOR gate 341. If all the input lines are 0s, then the NOR gate 341 output a bit 1. Otherwise, if any one of the input lines is not 0, the NOR gate 341 output a bit 1.

The Refresh Circuit 35

Figure 15:
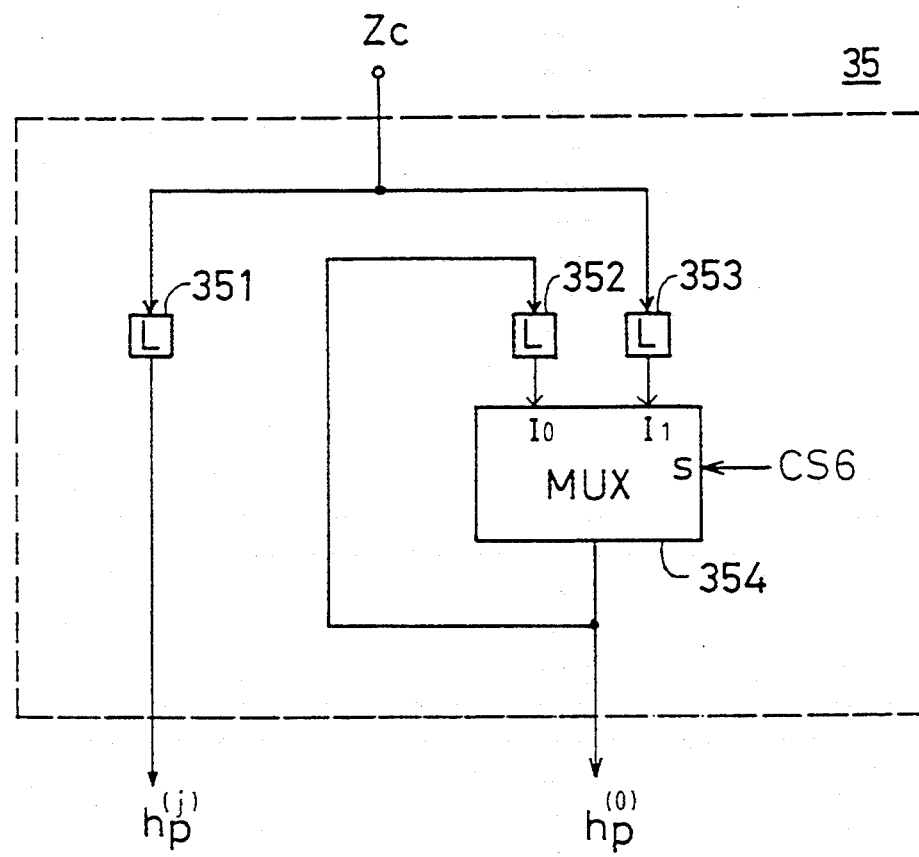
FIG. 15 shows the configuration of a refresh circuit.

The configuration of the refresh circuit 35 is shown in FIG. 15. The refresh circuit 35 comprises a multiplexer 351 and three latches 352, 353, and 354. The selection of the multiplexer 351 is controlled by a control sequence $CS_6$, where $$CS_6 = (1, 0^{n-1})_n^{d_6}.$$

The delay $d_6$ used here is decided by the latencies of the preceding modules and which should allow the first bit in $CS_6$ to be present to the multiplexer 351 when the outputs $Z_c$ of the zero checkers 34 is related to the determinants $\{\det(L_1^{(0)}), \det(L_2^{(0)}), \ldots, \det(L_t^{(0)})\}$. For example, if TYPE 1 syndrome generating module is employed, $d_6 = g_d + 4m$, where $g_d$ is the latency of the systolic matrix calculation circuit 32.

When the refresh circuit 35 receives the bit $Zc$ which corresponds to the syndromes of $\{S_1^{(0)}, S_3^{(0)}, \ldots, S_{2t-1}^{(0)}\}$, i.e. the decision bits $h_p^{(0)}$, the first bit 1 of $CS_6$ is present to the multiplexer 351 and whereby the bit $Zc$ is allowed to pass to the latch 353. During the following $n-1$ clock cycles following the presence of the first bit of $CS_6$, since the bit $h_p^{(0)}$ is stored in the latch 352, the bit $h_p^{(0)}$ is maintained as the output of the multiplexer 351. And each of the value of the value of the bit $Zc$ corresponding to the syndromes of $\{(S_1^{(j)}, S_3^{(j)}, \ldots, S_{2t-1}^{(j)})$ 56, $1 \leq j \leq n-1$, i.e. $h_p^{(j)}$, appears at the output of the latch 351 during each of those $n-1$ clock cycles.

In summary, during the clock cycle corresponding to the first bit of $CS_6$, the two output ports of the comparison circuit 30 are two same decision vectors of $H^{(0)}$. And during the following $n-1$ clock cycles, $H^{(0)}$ is maintained as a constant output and each of the decision vectors $H^{(j)}$, $j=1,2,\ldots,n-1$ will appear as the other output sequentially one after the other during each of the $n-1$ clock cycles

The Decision Circuit 40

The decision circuit 40 is employed for comparing each of the decision vectors $H^{(j)}$, $j=1,2,\ldots,n-1$ with the decision vector $H^{(0)}$. If a certain decision vector $H^{(p)}$, $1 \leq p \leq n-1$ is determined to be corresponding to a bit error, the decision circuit 40 will send out a correcting bit $E_c=1$; otherwise, $E_c=0$ is the output.

If $H^{(p)}$ is determined to be corresponding to an erroneous bit, then the erroneous bit is $r_{n-p}$ which, during this clock cycle, has been shifted p times to the right and thus is now stored in the right-most register of the decoding delay buffer 10. Both of the output of the decision circuit 40 and the right-most register of the decoding delay buffer 10 are coupled to a 2-input XOR gate 11, whereby a correcting bit of $E_c=1$ will invert the binary value of the bit $r_{n-p}$ and a correcting bit of $E_c=0$ will maintain the binary value of the same bit. Accordingly, reading the output of the XOR gate 11, a series of bits which form a binary word identical to the corresponding codeword can be obtained.

EXAMPLE: The Decision Circuit 40 for $t=2$

The configuration of the decision circuit 40 is determined only by t, and is independent of the block length n of the received word. By means of basic logic deductions, it is found that the output $E_c$ of the decision circuit 40 is always 0 if $H^{(j)}=H^{(0)}$ for any j.

For a double-error-correcting BCH decoder, it is necessary to distinguish the following sets:

$$\phi_0=\{(1,1)\},$$

$$\phi_1=\{(0,1)\}, \text{ and}$$

$$\phi_2=\{(0,0)\}$$

from one another. Accordingly, $E_c=1$ only when the following two conditions are satisfied:

$$H^{(0)} = [0, 1] \in \phi_1, \text{ and} \quad (1)$$
$$H^{(j)} = [1, 1] \in \phi_0;$$
or
$$H^{(0)} = [0, 0] \in \phi_2, \text{ and} \quad (2)$$
$$H^{(j)} = [0, 1] \in \phi_1.$$

Since the decision vectors $H^{(0)}$ and $H^{(j)}$ are defined in general as:

$$H^{(0)}=[h_1^{(0)}, h_2^{(0)}] \text{ and}$$

$$H^{(j)}=[h_1(j), h_2(j)],$$

the error-correcting bit Ec can be expressed in a Boolean function as:

$$E_c = \overline{h_1^{(0)}} \cdot h_2^{(0)} \cdot \overline{h_1^{(j)}} \cdot h_2^{(j)} + \overline{h_1^{(0)}} \cdot \overline{h_2^{(0)}} \cdot h_1^{(j)} \cdot h_2^{(j)}$$

$$= \overline{h_1^{(0)}} \cdot h_2^{(j)} \cdot [h_2^{(0)} \cdot \overline{h_1^{(j)}} + \overline{h_2^{(0)}} \cdot h_1(j)]$$

$$= \overline{h_1^{(0)} + \overline{h_2^{(j)}} + \overline{h_2^{(0)} + h_2^{(j)}}}$$

Figure 16:
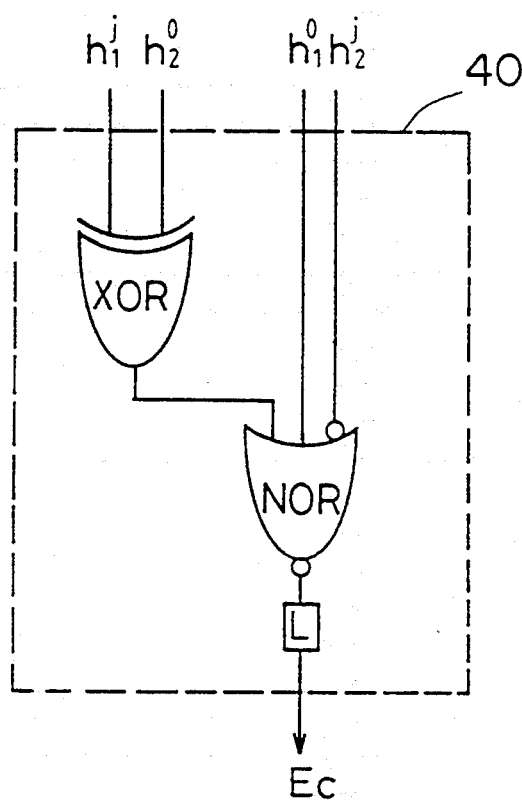
FIG. 16 shows the logic diagram of a decision circuit utilized in a double-error-correcting (t=2) BCH decoder.

A configuration of the decision circuit 40 in accordance with the above Boolean expression for Ec is shown in FIG. 16.

EXAMPLE: The Decision Circuit 40 for $t=3$

For a triple-error-correcting BCH decoder, it is necessary to distinguish the following sets:

$$\phi_0=\{(1,1,1)\},$$

$$\phi_1=\{(0,1,1)\},$$

$$\phi_2=\{(0,0,1)\}, \text{ and}$$

$$\phi_3=\{(x,0,0)\}$$

from one another. Accordingly, $Ec=1$ only when the following three conditions are satisfied:

$$H^{(0)} \in \phi_1 = \{[0, 1, 1]\}, \text{ and} \quad (1)$$
$$H^{(j)} \in \phi_0 = \{[1, 1, 1]\};$$
$$H^{(0)} \in \phi_2 = \{[0, 0, 1]\}, \text{ and} \quad (2)$$
$$H^{(j)} \in \phi_1 = \{[0, 1, 1]\};$$
$$H^{(0)} \in \phi_3 = \{[x, 0, 0]\}, \text{ and} \quad (3)$$
$$H^{(j)} \in \phi_2 = \{[0, 1, 1]\}.$$

Since the decision vectors $H^{(0)}$ and $H^{(j)}$ are defined in general as:

$$H^{(0)}=[h_1^{(0)}, h_2^{(0)}, h_3^{(0)}] \text{ and}$$

$$H^{(j)}=[h_1^{(j)}, h_2^{(j)}, h_3^{(j)}],$$

the error correcting bit $E_c$ can be expressed in a Boolean function as:

$$E_c = \overline{h_1^{(0)}} \cdot h_2^{(0)} \cdot h_3^{(0)} \cdot h_1^{(j)} \cdot h_2^{(j)} \cdot h_3^{(j)} +$$
$$\overline{h_1^{(0)}} \cdot \overline{h_2^{(0)}} \cdot h_3^{(0)} \cdot \overline{h_1^{(j)}} \cdot h_2^{(j)} \cdot h_3^{(j)} +$$
$$\overline{h_2^{(0)}} \cdot \overline{h_3^{(0)}} \cdot \overline{h_1^{(j)}} \cdot h_2^{(j)} \cdot h_3^{(j)}$$

Figure 17:
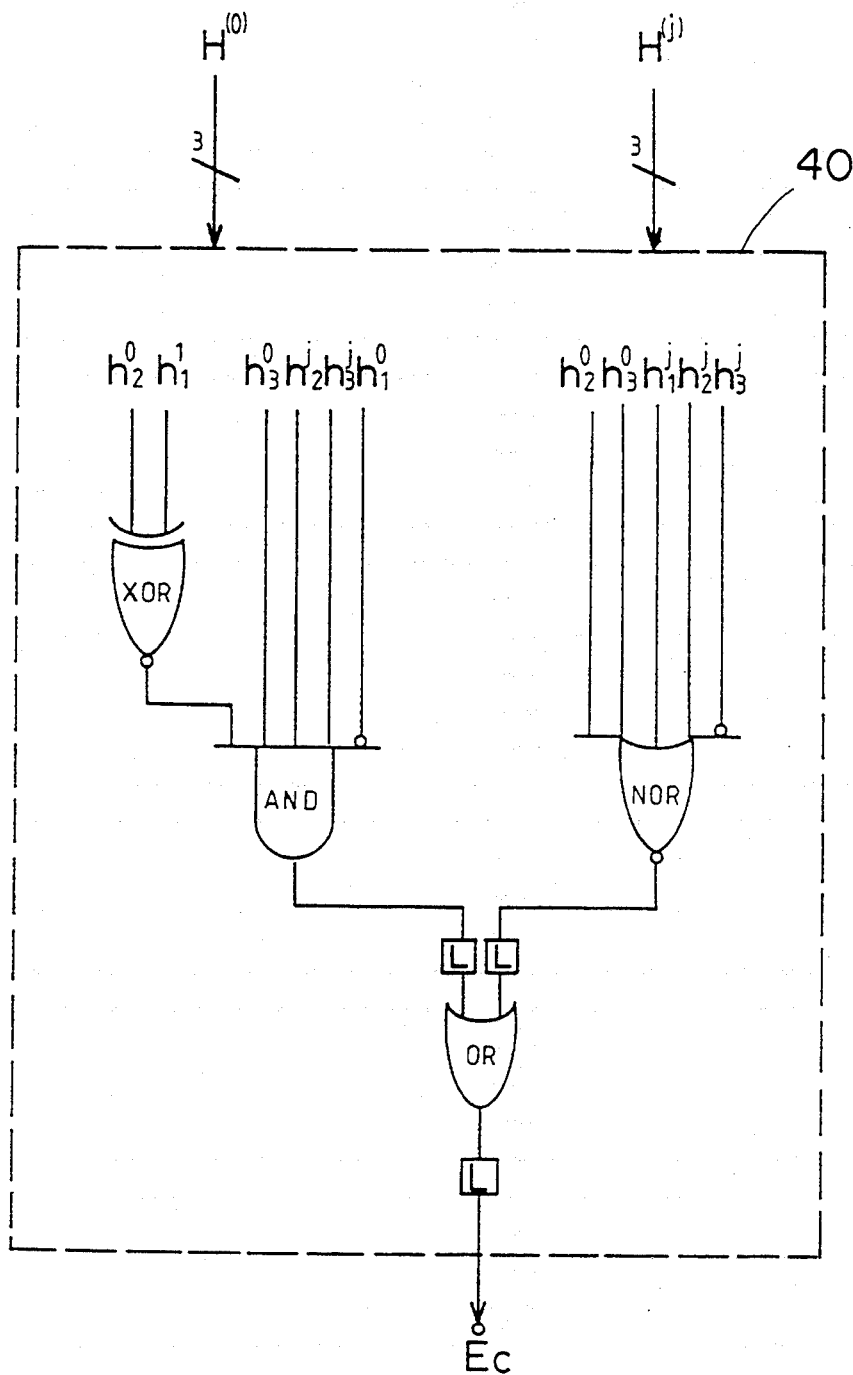
FIG. 17 shows the logic diagram of a decision circuit utilized in a triple-error-correcting (t=3) BCH decoder.

A configuration of the decision circuit 40 in accordance with the above Boolean expression for $E_c$ is shown in FIG. 17.

Figure 18:
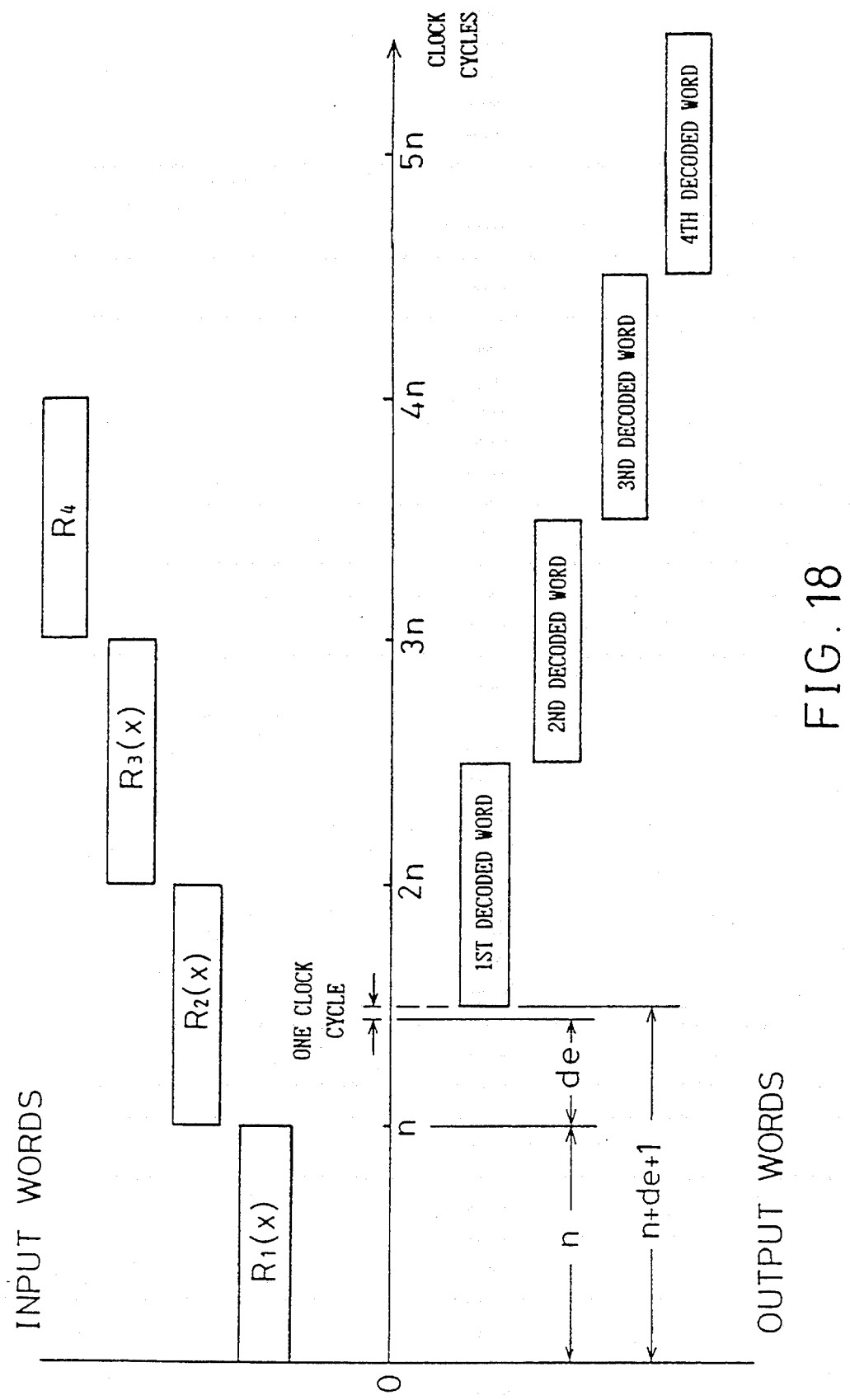
FIG. 18 is a diagram, showing the timing of the processing of the received words in the BCH decoder of FIG. 6.

The timing of the received words and the decoded words relative to the global clock cycle CLK is shown graphically in FIG. 18. The first decoded word is output by the BCH decoder 5 in $n+de+1$ clock cycles after the first word is received, in which n is the duration spent on the generation of the syndromes $\{S_1^{(0)}, S_2^{(0)}, \ldots, S_{2t}^{(0)}\}$ of a received word R(x), de is the overall latency of the circuits from the first stage of the syndrome generating module 20 to the last stage of the decision circuit 40, and the extra one clock cycle is spent on the generation of the decision vector H(0) of the received word R(x). From the graph, it can be seen that for a group of N received word each of which has a bit length of n, the time required for the decoding thereof is:

$$\begin{aligned} \text{decoding time} &= N \cdot n(n + de + 1) \\ &= n \cdot (N + 1) + de + 1 \\ &= O(n) \end{aligned}$$

As a consequence, the delay $n+de+1$ is often termed as the decoding delay of the BCH decoder.

The present invention has been described hitherto with an exemplary preferred embodiment. However, it is to be understood that the scope of the present invention need not be limited to the disclosed preferred embodiment. On the contrary, it is intended to cover various modifications and similar arrangements within the scope defined in the following appended claims. The scope of the claims should be accorded the broadest interpretation so as to encompass all such modifications and similar arrangements.

What is claimed is:

1. A Bose-Chaudhuri-Hocquenghem (BCH) decoder for correcting bit errors which occur during transmission of digital information that has been encoded into BCH binary codewords, wherein each binary codeword comprising binary bits and is represented by the polynomial R(x) and has an error pattern E(x), the BCH decoder comprising:

a decoding delay buffer shifting the bits of the word $R(x)$ to form a group of shifted words $R^{(j)}(x)$, $j=1,2,\ldots n-1$, and complementing a predetermined bit in each of the shifted words $R^{(j)}(x)$, $j=1,2,\ldots n-1$ to form a group of error-trial words $\underline{R}^{(j)}(x)$, $j=1,2,\ldots n-1$;

a syndrome generating module receiving the word $R(x)$ and generating syndrome values $S_i^{(0)}$, $i=1,3,\ldots 2t-1$ of the received word $R(x)$ which form syndrome matrices $L_p^{(0)}$, $p=1,2\ldots t$, and generating syndrome values $\underline{S}_i^{(j)}$, $i=1,3,\ldots 2t-1$ of the error-trial words $\underline{R}^{(j)}(x)$, $j=1,2,\ldots n-1$ which form syndrome matrices $\underline{L}_p^{(j)}$ $p=1,2,\ldots t,$;

a comparison module coupled to the syndrome generating module for determining determinants of the syndrome matrices $L_p^{(0)}$, $p=1,2,\ldots t$, and for determining determinants of the syndrome matrices $\underline{L}_p^{(j)}$, $p=1,2,\ldots t$, $j=1,2,\ldots n-1$ and for determining the zeroness of the determinants $\det(L_p^{(0)})$ for $p=1,2,\ldots t$ and $\det(\underline{L}_p^{(j)})$ for $p=1,2,\ldots t$ and $j=1,2,\ldots n-1$, and for determining a weight of the error pattern of the received word $R(x)$ in accordance with the zeroness of the determinants $\det(L_p^{(0)})$, $p=1,2,\ldots t$ and weights of the error patterns of the error-trial words $\underline{R}^{(j)}(x)$, $j=1,2,\ldots n-1$ in accordance with the zeroness of the $\det(\underline{L}_p^{(j)})$, $p=1,2,\ldots t$ and $j=1,2,\ldots n-1$;

a decision circuit receiving and comparing the weight of the error pattern of the received word $R(x)$ with the weights of the error patterns of the error-trial words $\underline{R}^{(j)}(x)$, $j=1,2,\ldots n-1$ from the comparison module and for outputting a correcting bit; and a logic circuit responsive to said correcting bit from the decision circuit for correcting the bit errors of the received word $R(x)$.

2. A decoder according to claim 1, wherein the zeronesses of the determinants $\det(L_p^{(0)})$ are defined by a vector:

$$H^{(0)}=[h_1^{(0)}, h_2^{(0)}, \ldots, h_t^{(0)}],$$

where $$h_p^{(0)}=1 \text{ if } \det(L_p^{(0)})=0, \text{ and}$$

$$h_p^{(0)}=0 \text{ if } \det(L_p^{(0)})\neq 0;$$

and the zeronesses of the determinants $\det(\underline{L}_p^{(j)})$ are defined by a vector:

$$H^{(j)}=[h_1^{(j)}, h_2^{(j)}, \ldots, h_t^{(j)}]$$

where $$h_p^{(j)}=1 \text{ if } \det(\underline{L}_p^{(j)})=0, \text{ and}$$

$$h_p^{(j)}=0 \text{ if } \det(\underline{L}_p^{(j)})\neq 0,$$

$j=1,2,\ldots,n-1$.

3. A decoder according to claim 1, wherein the weight of the error pattern of the received word $R(x)$ is determined in accordance with the following rules:

if $H^{(0)}\epsilon\{[1^t]\}$, there is no bit error;

if $H^{(0)}\epsilon\{[0, 1^{t-1}]\}$, there is one bit error;

if $H^{(0)}\epsilon\{[0, 0, 1^{t-2}]\}$, there are two bit errors;

if $H^{(0)}\epsilon\{[x^{p-2}, 0, 0, 1^{t-p}]\}$, there are p bit errors, $3\leq p<t$; and if $H^{(0)}\epsilon\{[x^{t-2}, 0, 0]\}$, there are t bit errors;
where the symbol "x" represent a don't care bit.

4. A decoder according to claim 1, wherein said syndrome generating module comprises:
 a systolic syndrome generator for generating the syndrome $S_i^{(0)}$, $i=1, 3, \ldots, 2t-1$ of R (x); and
 a systolic shifted-word syndrome generator, receiving the syndrome $S_i^{(0)}$, $i=1, 3, \ldots, 2t-1$ as the input, for generating accordingly the syndromes syndrome $\underline{S}_i^{(j)}$, $i=1, 3, \ldots, 2t-1$ of $\underline{R}^{(j)}(x)$.

5. A decoder according to claim 1, wherein said syndrome generating module comprises:
 a pair of LFSR syndrome generators connected in parallel for generating the syndromes $S_i^{(0)} i=1,3,\ldots,2t-1$ of the received word $R(x)$;
 a demultiplexer coupled between the input of the received word $R(x)$ and said pair of LFSR syndrome generators such that each received word $R(x)$ is sent alternatively to a selected one of said pair of LFSR syndrome generators; and
 a multiplexer coupled to said pair of LFSR syndrome generators for alternatively selecting the output of said pair of LFSR syndrome generators according to the alternatively selected one of said pair of LFSR syndrome generators.

6. A decoder according to claim 1, wherein said syndrome generating module comprises:
 a LFSR module for generating values $\{b_1^{(0)}(\alpha), b_3^{(0)}(\alpha), \ldots, b_{2t-1}^{(0)}(\alpha)\}$; and
 an LFSR syndrome generator, coupled to the output of said LFSR module, for generating the syndromes $\{S_1^{(0)}, S_2^{(0)}, \ldots, S_{2t}^{(0)}\}$ and syndromes $\{S_1^{(j)}, S_2^{(j)}, \ldots, S_{2t}^{(j)}\}$, $j=1,2,\ldots,n-1$.

7. A decoder according to claim 6, wherein a complementor is utilized for complementing each of the lowest order bits in the the syndrome values $S_i^{(j)}$, $i=1,3,\ldots,2t-1$, $j=1,2,\ldots,n-1$.

8. A decoder according to claim 1, wherein said comparison module comprises an array of t refresh circuits for sending out a decision vector $H^{(0)}$ simultaneously with one of the decision vectors $H^{(j)}$, $j=1,2,\ldots,n-1$ during one clock cycle.

9. A decoder according to claim 1, wherein the decision circuit comprises a plurality of logic gates for sending out the correcting bit whenever a vector $H^{(p)}$, $1\leq p\leq n-1$ has a weight less by one than a weight corresponding to a vector $H^{(0)}$.

* * * * *